United States Patent [19]

Levendel et al.

[11] Patent Number: 4,758,947
[45] Date of Patent: Jul. 19, 1988

[54] LIST PROCESSING METHOD AND APPARATUS

[75] Inventors: Ytzhak Levendel; Premachandran R. Menon, both of Naperville; Suresh H. Patel, Wheaton, all of Ill.

[73] Assignee: American Telephone and Telegraph Company and AT&T Bell Laboratories, Murray Hill, N.J.

[21] Appl. No.: 580,960

[22] Filed: Feb. 16, 1984

[51] Int. Cl.$^4$ .............................................. G06F 7/00
[52] U.S. Cl. .................................................... 364/200
[58] Field of Search ... 364/200 MS File, 900 MS File, 364/300, 491, 490

[56] References Cited

PUBLICATIONS

Koffman, "Problem Salving and Stuctured Programming in PASCAL" 1981, pp. 264–276.
Maruyama, K., "Circuit for Conditional Substring Function", IBM Technical Disclosure Bulletin, vol. 18, No. 19, Feb. 1976, pp. 3099–3104.
Roth, J. P., "Hardware Implementation of Software", IBM Technical Disclosure Bulletin, vol. 20, No. 10, Mar. 1978, pp. 4238–4240.
Birney, R. E. et al, "List Processor", IBM Technical Disclosure Bulletin, vol 20, No. 8, Jan. 1978, pp. 2972–2974.
A. N. Tenenbaum et al. "Data Structures Using Pascal", pp. 35–36, Prentice-Hall, Inc., (1981).
R. Clark et al, "The UCSD Pascal Handbook", p. 100, Prentice-Hall, Inc., (1982).
G. W. Cherry "Pascal Programming Structures", pp. 275–283, Reston Pub. Co., Inc., (1980).
J. Duntemann "Complete Turbo Pascal", pp. 67–77, Scott, Foresman and Co., (1986).
Y. Levendel et al., "Special-Purpose Computer for Logic Simulation Using Distributed Processing", *Bell System Technical Journal*, vol. 61, No. 10, (Dec. 1982), pp. 2873–2909.
Y. Levendel et al., "Parallel Fault Simulation Using Distributed Processing", *Bell System Technical Journal*, vol. 62, No. 10, (Dec. 1983), pp. 3107–3137.
G. Pfister, "The Yorktown Simulation Engine: Introduction", *Proc. 19th Design Automation Conf.*, Las Vegas, NV, Jun. 14–16, 1982, pp. 51–54.
M. M. Denneau, "The Yorktown Simulation Engine", *Proc. 19th Design Automation Conf.*, Las Vegas, NV, Jun. 14–16, 1982, pp. 55–59.
E. Kronstadt et al., "Software Support for the Yorktown Simulation Engine", *Proc. 19th Design Automation Conf.*, Las Vegas, NV, Jun. 14–16, 1982, pp. 60–64.

(List continued on next page.)

*Primary Examiner*—Gareth D. Shaw
*Assistant Examiner*—Jonathan C. Fairbanks
*Attorney, Agent, or Firm*—David Volejnicek

[57] ABSTRACT

Disclosed is a slave processor (100) for a multiprocessor logic circuit fault simulator. The slave processor has a hardware-based list processor (110) for performing set algebra operations on fault lists (300). The operation of the list processor centers on a characteristic vector (A) that has a bit (360) for each fault number (310) that can appear in a fault list. The bits are implemented in bit locations (210) of a register (201). The list processor also has a second vector (B), implemented in a register (202), whose bit locations form shift register pairs (208) with locations of vector A bits to store values of vector A bits shifted out by entry of new values. The list processor further has two stacks (A, B), implemented in memories (203, 204), for storing fault numbers. As fault numbers of a first fault list are loaded into the list processor, corresponding vector A bits are set, and the fault numbers are pushed onto the stack A. As fault numbers of subsequent fault lists are loaded, corresponding or non-corresponding vector A bits are set or reset, depending upon whether the set operation being performed is union, intersection, or difference. Thereafter, using the bit maps of vectors A and B, values are popped from the stack A, and selectively pushed onto the stack B, to generate an output fault list. The list processor also performs comparisons between pairs of lists. The processor optionally includes a third vector (C), implemented in a register (213), and associated controls (214) for processing star fault bits of fault numbers.

31 Claims, 12 Drawing Sheets

PUBLICATIONS

T. Sasaki et al., "HAL: A Block Level Hardware Logic Simulator", *Proc. 20th Design Automation Conf.*, Miami Beach, FL, Jun. 27-29, 1983, pp. 150-156.

N. Koike et al., "A High Speed Logic Simulation Machine", *Proc. Spring '83 COMPCON*, Feb./Mar. 1983, pp. 446-451.

M. Abramovici et al., "A Logic Simulation Machine", *Proc. 19th Design Automation Conf.*, Las Vegas, NV, Jun. 14-16, 1982, pp. 65-73.

D. B. Armstrong, "A Deductive Method for Simulating Faults in Logic Circuits", *IEEE Trans. Comp.*, vol. C-21, No. 5, (May 1972), pp. 464-471.

Y. Levendel, "Some Experiments and Problems in Fault Simulation", *Technical Report*, Math-71, University of Negev, May 1974.

S. G. Chappell et al., "LAMP: Logic-Circuit Simulators", *Bell System Technical Journal*, vol. 53, No 8, (Oct. 1974), pp. 1451-1476.

H. Y. Chang et al., "Deductive Techniques for Simulating Logic Circuits", *Computer*, vol. 8, No. 3, (Mar. 1975), pp. 52-59.

A. Miara et al., "Dynamic and Deductive Fault Simulation", *Proc. 15th Design Automation Conf.*, Las Vegas, NV, Jun. 19-21, 1978, pp. 439-443.

P. R. Menon et al., "Deductive Fault Simulation with Functional Blocks", *IEEE Trans. Comp., vol. C-27, No. 8, (Aug. 1978), pp. 689-695.*

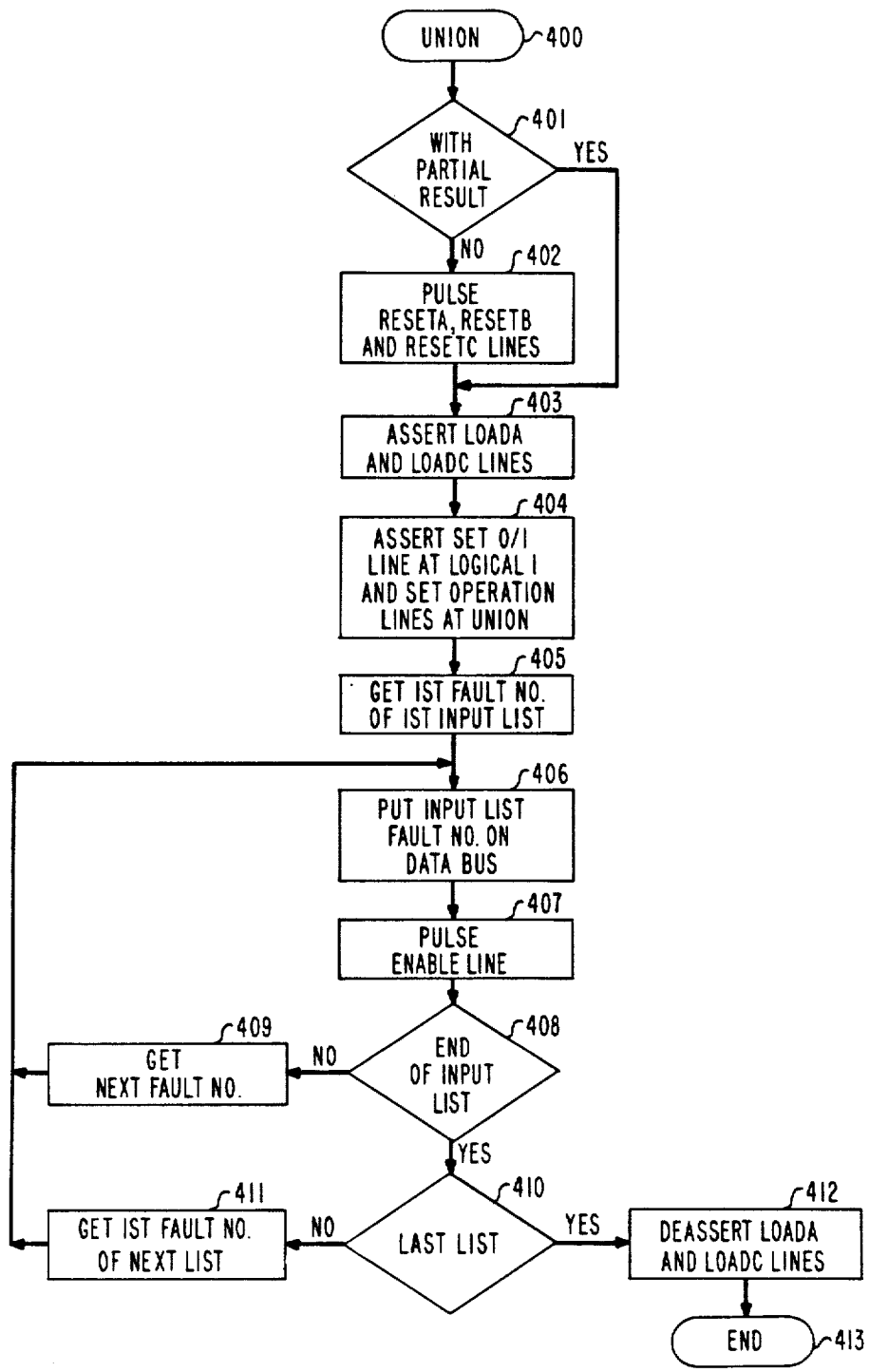

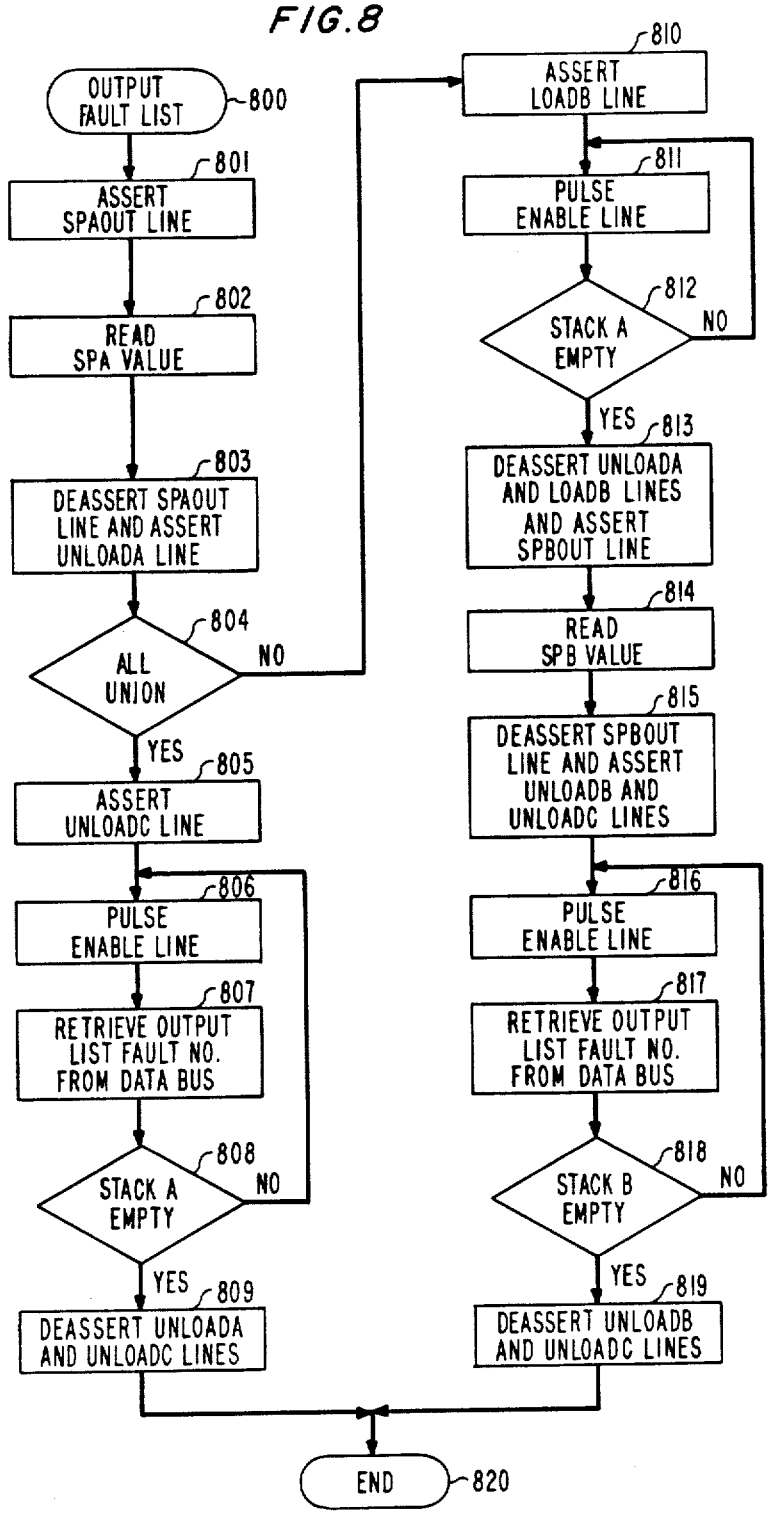

LIST PROCESSING METHOD AND APPARATUS

TECHNICAL FIELD

This invention generally relates to special purpose processing systems, and particularly relates to list processors and their application to logic circuit fault simulators.

BACKGROUND OF THE INVENTION

The logic circuit simulator is an important component of any computer-aided design (CAD) system for digital circuits. It is used to predict logic circuit operation and performance under normal and faulty conditions. Applications of logic circuit simulators can be divided into two major area—the verification of new logic hardware designs and the analysis of the behavior of these designs under faults.

The circuit to be analyzed is modeled on a logic circuit simulator using a circuit description language. This language describes the connectivity and behavior of the circuit. The modeling information typically includes element type (gate or functional), associated delays, and interconnection data. The computer model is then compiled into a predefined data structure and simulated inputs are applied either dynamically (at prescribed times) or statically (after the circuit is stabilized). If fault simulation is being performed, faults are inserted in the model. The simulated output is recorded either in plot form, for fault-free simulation, or tabular form, for fault simulation.

Currently, most digital circuits are simulated on large general-purpose computers. While this approach is satisfactory for up to many thousands of gates, its applicability to very large scale integrated (VLSI) circuits is doubtful, at least in the manner that it is currently used. Very large simulation times and costs result when dealing with circuits of VLSI complexity (more than about 100,000 gates on a single chip). There is a definite need for more sophisticated and cost-effective simulators in the VLSI era.

Existing logic circuit simulators are implemented in software which is executed on a general purpose computer. To date, a large amount of work has been invested in optimizing this software, by improved data structures and more efficient algorithms. But the capacity of the existing software-based simulators is becoming exhausted as VLSI-complexity circuits are being designed. The wider use of VLSI devices will largely depend on the future availability of lower-cost simulators that run at high speeds. However, the speed improvements required for efficient VLSI design cannot be obtained by using faster processors. One way to obtain further improvements in the performance of the logic circuit simulators is to optimize the hardware on which the simulation software executes. With the advent of low cost microcomputers, the development of special purpose logic simulation hardware becomes attractive. Possible benefits are higher speeds, lower costs, and greater flexibility (for example, better integration in a test station).

The architecture of a special purpose logic simulation machine for true value simulation and fault simulation has been developed and described. See, for example, Y. H. Levendel, P. R. Menon, and S. H. Patel, "Special Purpose Logic Simulator Using Distributed Processing," *Bell System Technical Journal*, (B.S.T.J.) Vol. 61, No. 10 (December 1982), pp. 2873-2909, and Y. H. Levendel, P. R. Menon, and S. H. Patel, "Parallel Fault Simulation Using Distributed Processing," B.S.T.J., Vol. 62, No. 10 (December 1983), pp. 3107-3137. The system described there is essentially a parallel-processing network based on an interconnection of low-cost microcomputers. The circuit to be simulated is partitioned into subcircuits and each subcircuit in simulated in a separate microcomputer, referred to as a slave processor. The modularity of the proposed simulator allows easy increase of computational power.

For a given fixed number of processors, however, the speed of the multiprocessor-based simulator is limited by the execution time of the slave processors. To, obtain further speed improvements, the slave processors must be able to execute the simulation process faster. In particular, it is estimated that in deductive fault simulation, which is an efficient method of simulating a large number of faults, up to 80% or more of the processing time is spent in computation of fault lists and in movement of fault lists between a slave processor and its input/output buffers. The time required for these operations therefore needs to be reduced.

SUMMARY OF THE INVENTION

It is these and other objectives that the present invention is directed to achieving. According to the invention, special hardware is provided for processing lists of elements such as faults, which hardware processes lists in an improved manner. The hardware, for processing a plurality of lists each of which includes at least one element, is based on a plurality of indicators, such as register bits, referred to as a vector. One indicator is associated with each unique element of the lists. The elements in a list need not be ordered. The hardware further includes apparatus for receiving the lists and controls for the indicators. The indicator controls respond to receipt of list elements on the receiving apparatus by manipulating the indicators in a manner dependent upon the type of processing being performed.

In general, list processing involves the following manipulations. First, indicators associated with the elements of one received list are set to a first state. Then, selected indicators are set to a first or second state, depending upon the type of processing, in response to receipt of the elements of the other lists. The indicators are then used to generate either a signal indicative of the result of the processing or an output list of elements associated with indicators set to the first state. The signal is generated on signal transmission apparatus by apparatus that monitors the indicators to determine the result of the processing. The output list is stored in a memory by the memory's control apparatus.

In particular, the types of list processing operations that are performed by the list processing hardware are union, intersection, difference, and comparison of lists. Indicators associated with the elements of the lists other than the one list are set to the first state for the union operation, and are set to the second state for the difference. Indicators not associated with the elements of each list other than the one list are set to the second state for the intersection operation. Indicators associated with the elements of the lists other than the one list are examined, and may be either set or reset, for the comparison operation. An output list is generated as a result of the union, intersection and difference operations, while a signal indicative of whether or not the compared lists are the same is generated as a result of the comparison operation.

Advantageously, the inventive list processing hardware and method provide fast manipulation of lists, fast enough to be suited for simulation of large ard complex circuits, including VLSI circuits. The list processing hardware is significantly—up to orders of magnitude—faster in processing lists than list processing operations implemented in software. Also, the list processing hardware implementing the inventive list processing method is much simpler, and hence much less costly, than hardware required to implement other list processing methods. Furthermore, a processor, such as a slave processor of a logic fault simulator, that incorporates the inventive list processing arrangement along with a memory dedicated to storing lists and a direct memory access (DMA) unit for moving lists between the list processin9 hardware and the list memory, achieves not only lower costs and fast processin9 of lists, but also fast movement of lists between various parts of the processor, which further improves the performance of the processor.

These and other advanta9es and features of the present invention will become apparent from the followin9 description of the illustrative embodiment of the invention taken to9ether with the drawin9.

BRIEF DESCRIPTION OF THE DRAWING

FIG. 4 is a logical flow diagram of the rnion operation of the slave processor of FIG. 1;

FIG. 8 is a logical flow diagram of the output list formation and transfer operation of the slave processor of FIG. 1.

DETAILED DESCRIPTION

SLAVE PROCESSOR

Figure 1:
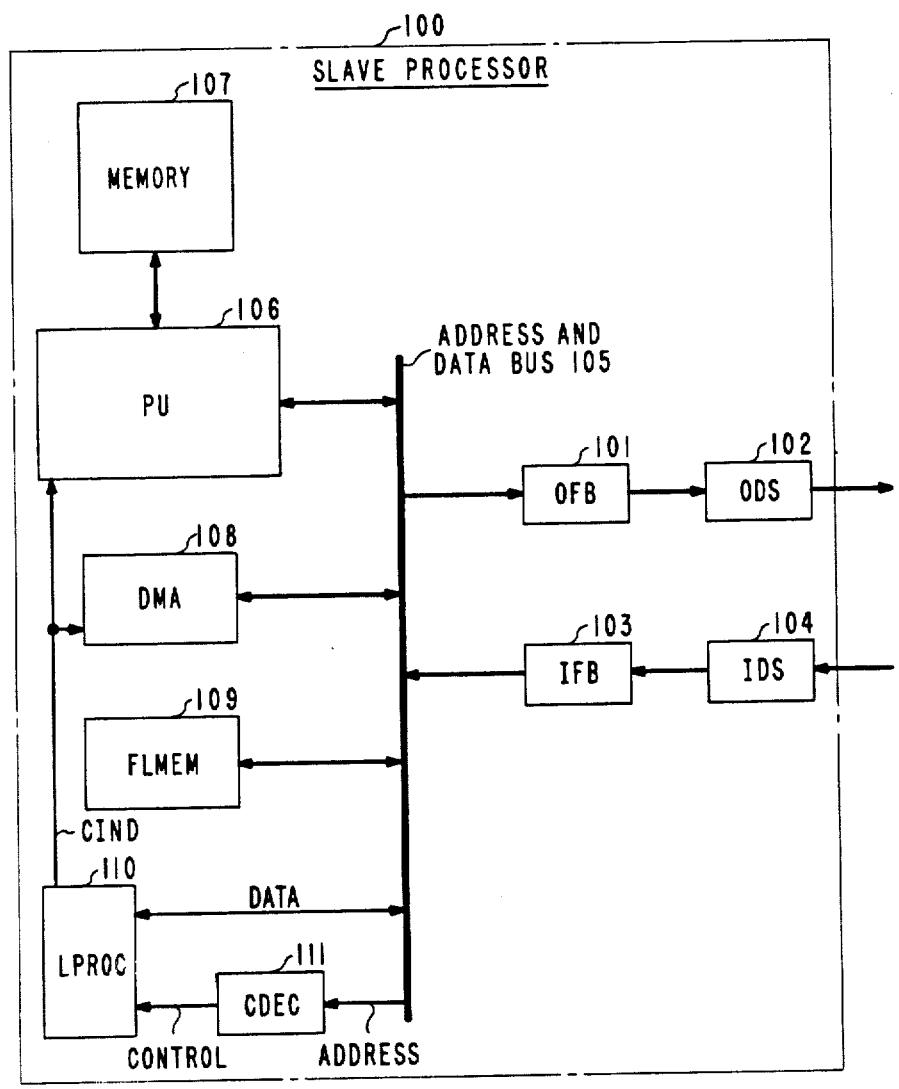
FIG. 1 is a block dia9ram of a slave processor of a logic fault simulation system that includes are illustrative embodiment of the invention.

Shown in FIG. 1 is a block diagram of a slave processor 100 for a multiprocessor-based logic fault simulation system such as is described in the B.S.T.J. articles cited above. The slave processor 100 is representative as well of the other slave processors of such a system. As described in the B.S.T.J. articles, each slave processor of the simulation system simulates a portion, i.e., a subcircuit, of the circuit being simulated. The specification of the subcircuit that is being simulated by a slave processor resides in that slave processor's memory.

The slave processor 100 is particularly suited for deductive fault simulation use. The deductive fault simulation method simulates the fault-free circuit and separately deduces the effects of faults on the output of a device by operations on lists of faults present at the inputs of the device. Associated with each signal lead is a fault list, which is a set of faults, any one of which will cause the signal value to be different from the normal value. The effects of faults are propagated through the circuit by an algebra of sets. Deductive fault simulation is well known in the art. See D. B. Armstrong, "A Deductive Method for Simulating Faults in Logic Circuits," *IEEE Trans. Comp.*, Vol. C-21, No. 5 (May 1972), pp. 464-471; Y. H. Levendel, "Some Experiments and Problems in Fault Simulation," Technical Report, Math-71, University of Negev, May 1974; S. G. Chappell, C. H. Elmendorf, and L. D. Schmidt, "LAMP: Logic-Circuit Simulators," *B.S.T.J.* Vol. 53, No. 8 (October 1974), pp. 1451-1476; H. Y. Chang and S. G. Chappell, "Deductive Techniques for Simulating Logic Circuits," *Computer*, Vol. 8, No. 3 (March 1975), pp. 52-59; A. Miara and N. Ciambiasi, "Dynamic and Deductive Fault Simulation," *Proc. 15th Design Automation Conf.*, Las Vegas, NV, June 19-21, 1978, pp. 439-443; and P. R. Menon and S. G. Chappell, "Deductive Fault Simulation with Functional Blocks," *IEEE Trans. Comp.*, Vol. C-27, No. 8 (August 1978), pp. 689-695.

Deductive fault simulation is well defined for two logic values and is also applicable to three logic values, although perhaps with some loss of information. If the fault-free signal value of a lead is of a known type, i.e., 0 or 1, but if its signal value in the presence of a fault is of an unknown type, i.e., undefined, the fault is included in the fault list of the signal lead as a "star fault", denoted by "*". The star fault is identified in the signal lead's fault list by a "star fault" bit. The star faults are conditionally detectable and may or may not be detected, depending upon the actual logic values present on the unknown inputs at the time the test is executed. If some of the input fault-free signal values of an element are unknown but the output fault-free signal value of the element is known, then the propagated fault list is computed ignoring fault lists on all the unknown inputs. All the faults in the propagated fault list are then changed to star faults. If the output fault-free signal value of an element is unknown, then the fault list associated with that output is made null.

The simulation procedure of the slave processor 100 generally follows that used for deductive fault simulation on general purpose computers except that it is impacted by the need to communicate information between processors. All slave processors, including the slave processor 100, of a multiprocessor logic fault simulator contain the same deductive fault simulation program. The data communication mechanism for communicating data between processors is the same as that for true value simulation and parallel fault simulation methods. (See B.S.T.J. articles cited above). The slave processor 100 uses an output data sequencer (ODS) 102 to transfer data out to, and an input data sequencer (IDS) 104 to receive data from, other processors of the simulation system. The slave processor 100 is isolated from the rest of the simulation system by means of an input first-in, first-out (FIFO) buffer (IFB) 103 and an output FIFO buffer (OFB) 101. Thus the slave processor 100 can receive data from, or send data to, another processor independently of whether it or the destination processor is active. The data transmitted between slave processors are the circuit element number in the destination processor, the fault-free si9nal value, the deductive fault list, and the len9th of the fault list.

The slave processor 100 includes a processing unit (PU) 106. The PU 106 is a general-purpose microprocessor. The PU 106 performs the evaluation of the elements or functions of the subcircuit being simulated by the slave processor 100, and also performs event scheduling in the simulation procedure being performed by the slave processor 100.

The simulation program for execution by the PU 106 and the specification of the subcircuit being simulated by the slave processor 100 reside in a memory 107. In particular, an element table of the memory 107 contains the list of elements comprising the subcircuit being emulated, and the interconnection data and signal values therefor. And a timing wheel of the memory 107 contains signal propagation events that are scheduled for evaluation in the future, chained together as a linked list.

The slave processor 100 further comprises a list processor (LPROC) 110 with an associated control decoder (CDEC) 111, a separate fault list memory (FLMEM) 109, and a direct memory access (DMA) unit 108. The various devices that make up the slave processor 100 are interconnected for communication by an address and data bus 105.

As the name implies, the FLMEM 109 is used to store fault lists. A representative fault list 300 is logically diagramed in FIG. 3. For purposes of this application, a list is a set of elements each represented by a number or some other code. A fault list such as the list 300 is a set of fault numbers 310 each one of which represents a fault which, when present will cause the signal value on a lead to be opposite its fault-free value or, in the case of a star fault, will cause the level to have an indeterminate signal value. A fault list 300 is associated with each lead of the circuit being simulated.

Returning to FIG. 1, fault lists are stored in and retrieved from the FLMEM 109 by the DMA unit 108. Under control of the PU 106, the DMA unit 108 provides high-speed data movement between the FLMEM 109, the OFB 101, the IFB 103, and the list processor 110. Performing the direct memory access consists of loading the list length and the list source and destination addresses into the DMA unit 108 and instructing it to start. When data is moved out from the slave processor 100, the PU 106 loads the element number of the affected circuit element, the variable number of the affected circuit element's input, the input fault-free value, and the fault list length into the OFB 101, while it instructs the DMA unit 108 to load the fault list. The PU 106 can be doing other work while the DMA unit 108 moves the fault list to or from the FLMEM 109. The DMA unit 108 informs the PU 106 via an interrupt when it finishes moving the fault list.

The list processor 110 performs the list processing functions that are required by deductive simulation. The PU 106 selectively sends to the list processor 110 a plurality of input fault lists, an indication of the operation to be performed for each input fault list, fault deletion and insertion information, and finally the old output fault list for comparison with the new output fault list. The list processor 110 performs the indicated operations on the input fault lists and selectively sends back an indication to the PU 106 of whether the output fault list changed the fault list length, and the resulting fault list.

The PU 106 controls the list processor 110 through the control decoder (CDEC) 111. The control decoder 111 is connected to the ADDRESS bus of the address and data bus 105 and to the various control signal lines of the list processor 110. The control decoder 111 receives control words, in the form of addresses, over the ADDRESS bus and in response thereto asserts and deasserts various control signal lines of the list processor 110.

Operations that are performed by the list processor 110 include union of lists, intersection of lists, difference of lists, and comparison of lists. The list processor 110 operates on multiple fault lists at a time, although the lists have to be loaded into the list processor 110 sequentially.

The operations to be performed on the input fault lists are set up so that they can be performed between a partial result i.e., an intermediate fault list, stored in the list processor 110 and the next input fault list. The partial result is a fault list like any other. When the operation involves a partial result, the partial result does not have to be loaded again into the list processor 110. It is there as a result of the operations already performed in forming it, which operations gave the same effect in relevant aspects as loading the partial result into the list processor 110. Hence, for purposes of this application, the operations involved in creating the partial result are considered to load the partial result into the list processor 110, and only the other input fault lists must thereafter be loaded into the list processor 110.

The operation performed between an intermediate fault list and the next input fault list need not be the same operation as the operation or operations that produced the intermediate fault list. For example, the intersection of the lists $L_1$ and $L_2$, and the difference between the intersection and list $L_3$, is performed by first loading list $L_1$ into the LPROC 110. Intersection is performed between the list in the LPROC 110 and list $L_2$. The resulting intermediate output list remains in the LPROC 110. Difference operation is then performed between the intermediate list in the LPROC and list $L_3$. The final list is present in the LPROC 110.

This sequencing of operations is always possible for gate level logic circuits. For AND and NAND type gates, if all the inputs are logical one, then the output fault list is the union of all input faults; else the output fault list is given by the difference of: the intersection of lists $X_{i0}$ and the union of lists $X_{i1}$, where $X_{i0}$ are the fault lists of inputs with logical zero fault-free value and $X_{i1}$ are the fault lists of inputs with logical one fault-free value. Note that instead of "subtracting" the union of $X_{i1}$, each fault list $X_{i1}$ can be "subtracted" sequentially from the intersection. For OR and NOR type gates, if all the inputs are logical zero, then the output fault list is the union of all input fault lists; else the output fault list is given by the difference of: the intersection of lists $X_{i1}$ and the union of lists $X_{i0}$. For a NOT type gate, the output fault list is same as the input fault list.

Faults are inserted into a fault list by performing the union operation between the fault list and the fault numbers of faults being inserted. Faults are deleted from a fault list by performing the difference operation between the fault list and the fault numbers of faults being deleted.

Figure 3:
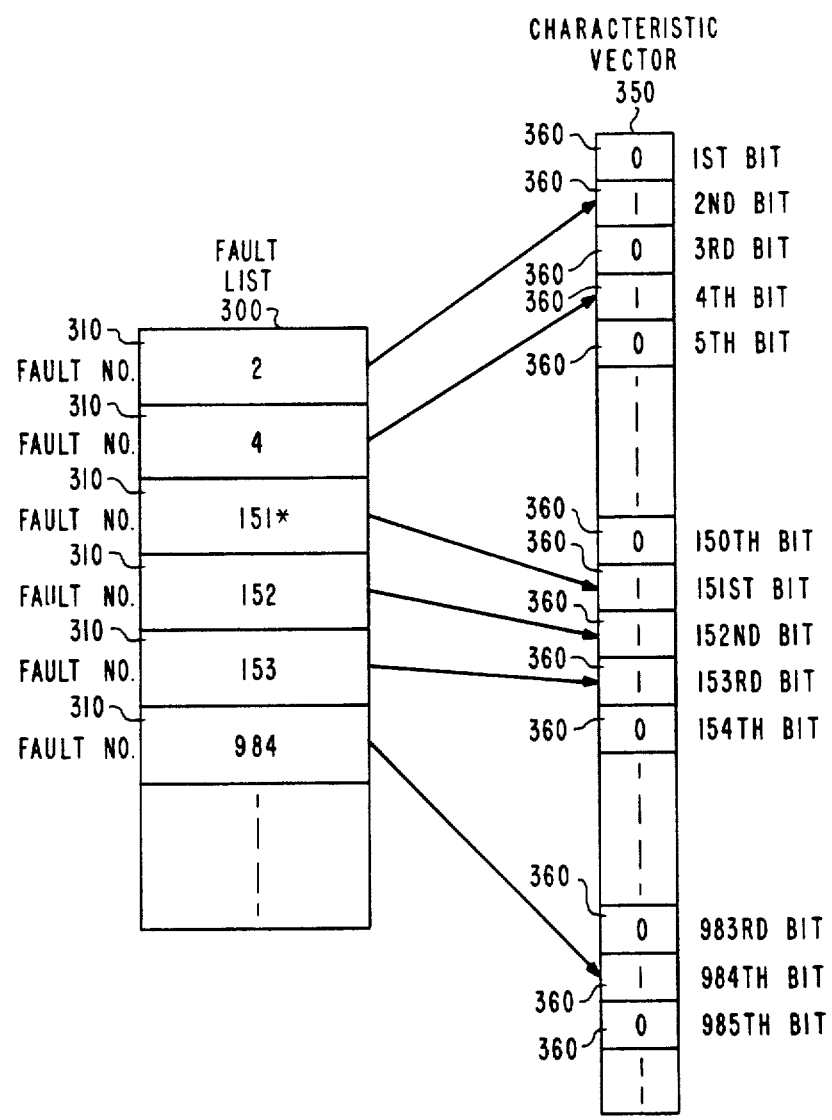
FIG. 3 is a logical block diagram of a representative fault list and of a characteristic vector of the list processor of FIG. 1, and their relationship.

The list processor 110 is based on characteristic vectors. A representative characteristic vector 350 is logically diagramed in FIG. 3. FIG. 3 also shows the relationship of the characteristic vector 350 to the fault list 300. The characteristic vector 350 is a mapping of the fault list 300. The characteristic vector comprises a plurality of bits 360, one for each unique fault number 310 that can appear in a fault list 300. "Unique" for purposes of this application implies that plural occurrences of the same fault number, whether of the definite or starred fault type, are subsumed in the same unique fault number. Because, potentially, the fault number 310 of any fault that is being simulated in a circuit can appear in a fault list 300, the characteristic vector 350 has one bit associated with each fault that is being simulated. Each bit 360 of the vector 350 serves as an indicator of the presence or absence of the associated fault number 310 from the fault list 300. A bit 360 of a characteristic vector 350 is set to a logical one value if the mapped fault list 300 includes the fault number 310 associated with that bit 360. For example, as shown in FIG. 3, if the associated fault list 300 includes the fault numbers "2", "4", "151*", "152", "153", and "984", the corresponding bits 360—the second, fourth, 151st, 152d, 153d, and 984th bits 360—of the characteristic vector 350 are set to the logical one value. Hence the fault numbers 310 of a fault list 300 address and uniquely identify their corresponding bits 360 in the characteristic vector 350.

LIST PROCESSOR

Figure 2:
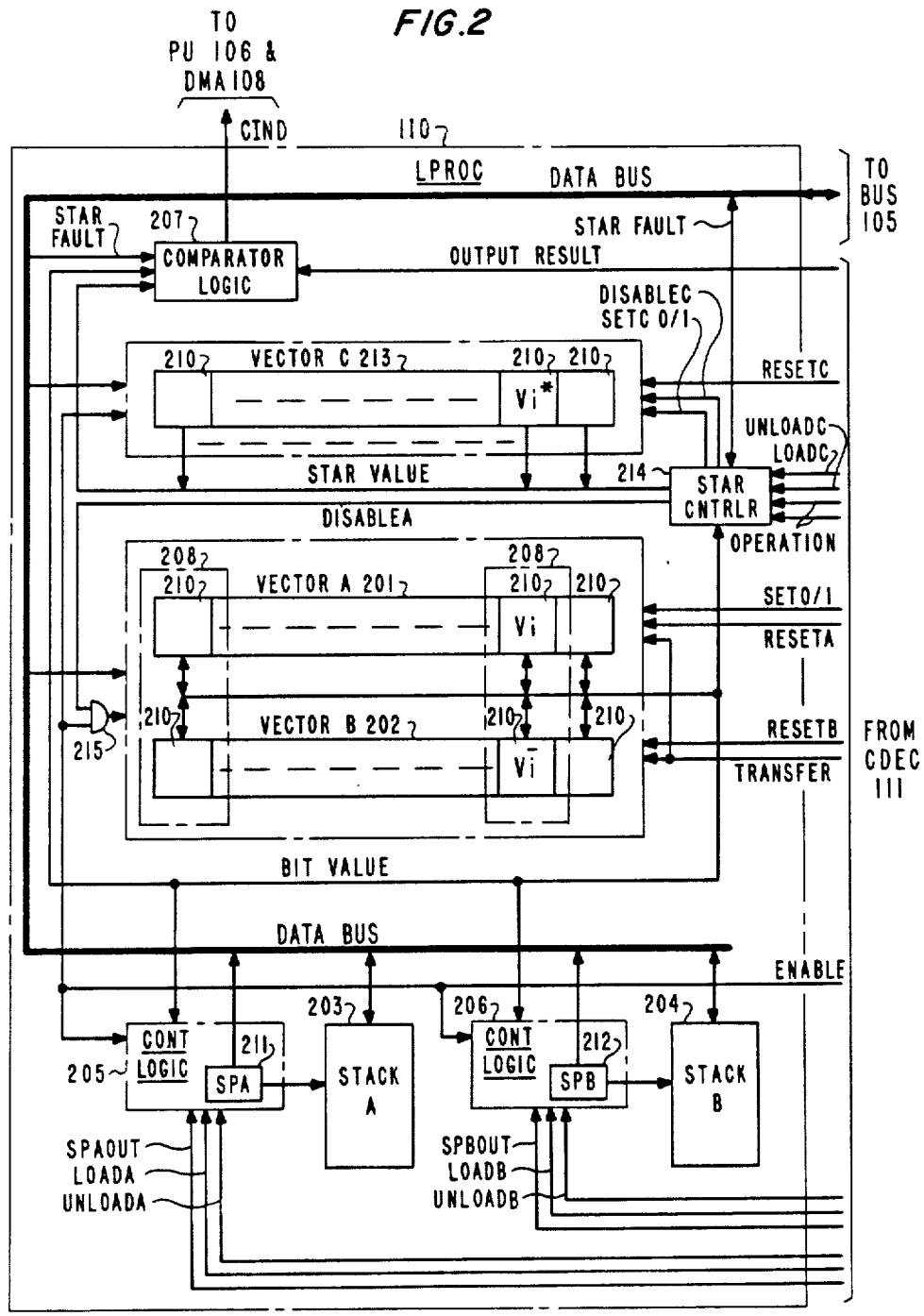
FIG. 2 is a block diagram of the list processor of the slave processor of FIG. 1.

The structure of the list processor 110 based on characteristic vectors is shown in FIG. 2. The list processor 110 includes two characteristic vectors, A and B, for processing of fault numbers, and optionally, a third vector, C, for processing of star fault bits of the fault numbers. The star fault bits are processed separately from the fault numbers and their processing need not be included in the list processor 110. Hence, the inclusion in the list processor 110 of the vector C, along with its associated controls and functions, is optional.

Each vector A, B, and C is implemented in a conventional register 201, 202, and 213, respectively. Each register 201, 202, and 213 has one addressable bit location 210 for each fault number 310 that can appear in a fault list 300. Hence one bit location 210 in each register 201, 202, and 213 implements a bit 360 of a characteristic vector.

The bit locations 210 of the registers 201, 202, and 213, and hence the vector bits 360, are externally addressable by fault numbers. For this purpose, the registers 201, 202, and 213 are connected to the DATA bus of the address and data bus 105. The DATA bus is the means by which the list processor 110 receives input fault lists 300. A device loads a fault number 310 from an input fault list 300 into the list processor 110 by putting the fault number 310, along with a star bit if the fault number represents a star fault, on the DATA bus and pulsing, i.e., momentarily asserting, an ENABLE control signal line which connects to the registers 201, 202, and 213. The fault number 310 that is put on the DATA bus is conveyed thereby to the list processor 100 and addresses therein a bit location 210 in each register 201, 202, and 213.

Figure 6A:
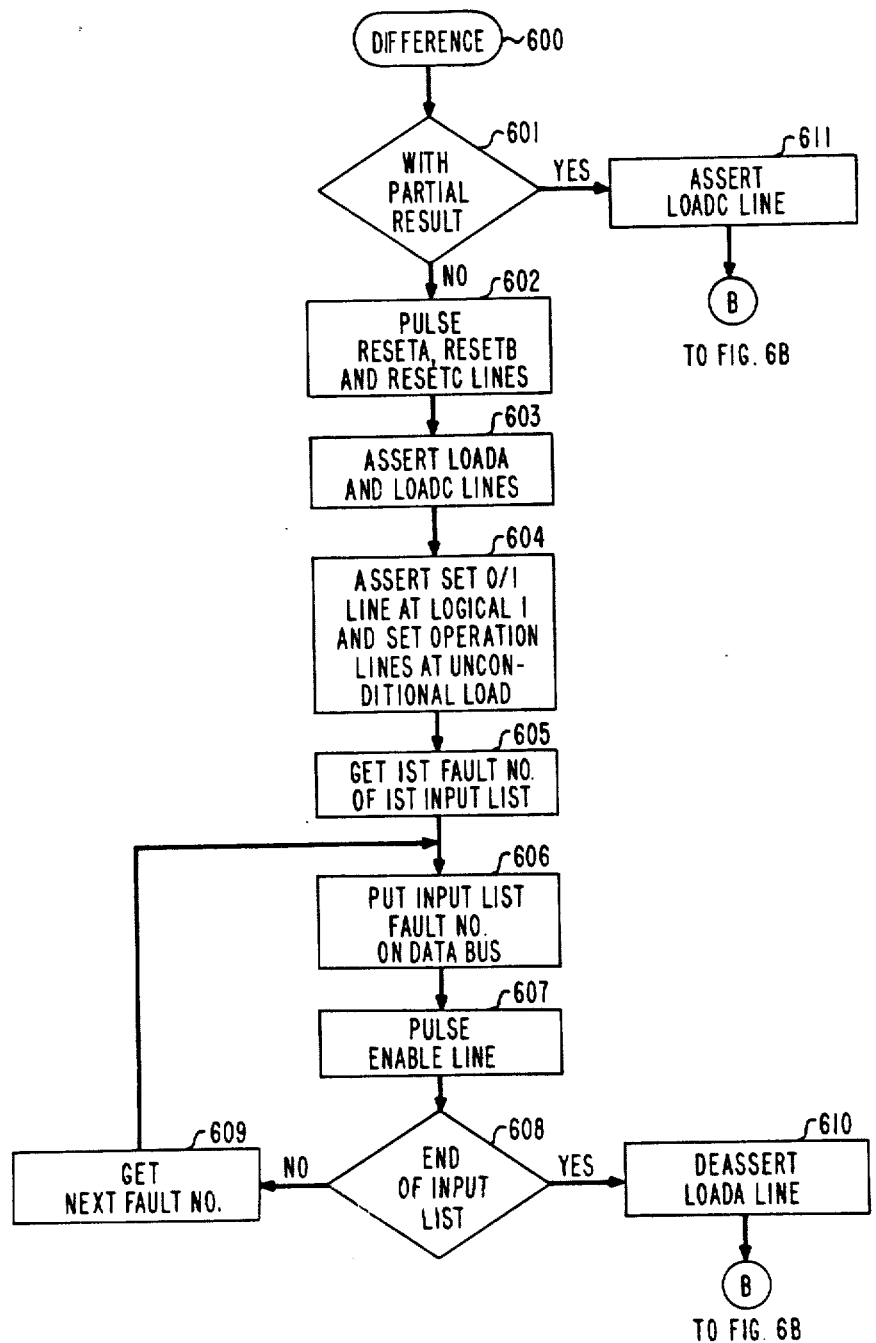
FIGS. 6A-B are a logical flow diagram of the difference operation of the slave processor of FIG. 1.
Figure 6B:
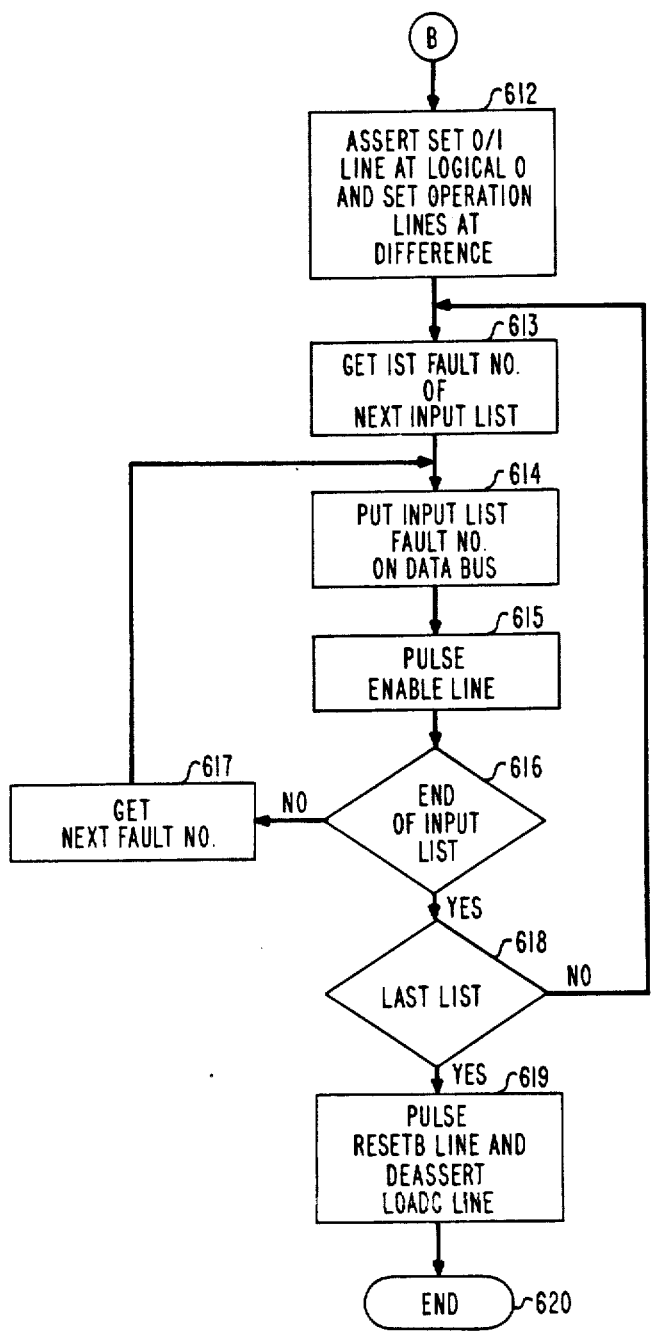

The ENABLE line is connected to the registers 201 and 202 through an AND gate 215. With one exception, discussed below in conjunction with FIGS. 6A-B, the AND gate 215 is always open to the passage of ENABLE signals. The pulsing of the ENABLE line causes the addressed bit location 210 in the vector A register 201 to be set to a logical zero or one state, depending on the state of a SET 0/1 control signal line that connects to the registers 201 and 202. The state of the SET 0/1 line depends on the operation being performed, and is asserted on a per-fault-list basis. Following addressing, the value of the addressed bit location 210 in the vector A register 201 is $v_i$.

Locations 210 at the same relative position in the registers 201 and 202, one in each register, form a shift register pair 208. The shift register pair 208 automatically stores the current and previous value of the bit location 210 of the vector A register 201. When a bit location 210 in the vector A register 201 is addressed, and the ENABLE line is pulsed, the now-outdated bit value $v_i^-$ that was stored at that location is automatically shifted into the corresponding bit location 210 in the vector B register 202. The old value of the bit location 210 of the vector B register 202 is overwritten. The vector B register 202 stores the bit value $v_i^-$. Also, while the ENABLE signal line is pulsed, the bit value $v_i^-$ is displayed on a BIT VALUE signal line.

The values of all the bit locations 210 in the vector B register 202 can be transferred to corresponding bit locations 210 in the vector A register 201 by issuing a transfer pulse on the TRANSFER control signal line that connects to the registers 201 and 202.

The pulsing of the ENABLE line causes the addressed bit location 210 of the vector C register 213 to be displayed on a STAR VALUE control signal line. Thereafter, the addressed bit location 210 of the vector C register is selectively set to a logical zero or one state, depending on the state of a SETC 0/1 control signal line that connects to the register 213. The state of the SETC line, and hence the new value of the addressed location 210 of the vector C register 213, generally depends upon four conditions: (a) the value $v_i^-$ of the addressed bit location 210 of the vector A register 201, (b) the value $v_i^*$ of the addressed bit location 210 of the vector C register 213, (c) the type of operation being performed, and (d) whether the fault number incoming over the DATA bus represents a star fault. These four conditions are monitored and translated into the appropriate state of the SETC 0/1 line by a star controller 214. The star controller 214 determines condition (a) by monitoring the BIT VALUE line, determines condition (b) by monitoring the STAR VALUE line, determines condition (c) by monitoring a pair of OPERATION control signal lines, and determines condition (d) by monitoring a bit line of the DATA bus, designated in FIG. 2 as the STAR FAULT control signal line, that carries the star fault bit value.

The star controller 214 is also connected to LOADC and UNLOADC control signal lines. Signals on these lines are used to determine whether information is to be stored in or retrieved from the vector C register 213. When the LOADC signal line is asserted, the star controller 214 monitors and determines the four conditions described above by monitoring the appropriate signal lines and in response asserts the SETC 0/1 line at a high or a low state to enter a bit value in the vector C register 213. But when the UNLOADC signal line is asserted, the star controller 214 leaves the SETC 0/1 line idle, asserts a DISABLE control signal line leading to the vector C register 213 to cause the vector C register 213 to cease being responsive to signal values on these SETC 0/1 line, and connects the STAR VALUE line to the STAR FAULT line to cause a bit value from the vector C register 213 to be output on the DATA bus without changing that bit value in the vector C register 213. When neither the LOADC nor the UNLOADC line is asserted, the star controller 214 is disabled.

Also, each vector register 201, 202, and 213 can be selectively reset, i.e., zeroed out, by issuing a separate reset pulse on RESETA, RESETB, and RESETC control signal lines that connect to the registers 201, 202, and 213, respectively.

The list processor 110 also includes two stacks A and B. Each stack A and B is implemented as a conventional last in - first out (LIFO) memory 203 and 204, respectively. The stack memories 203 and 204 are used to store the fault numbers 310 of intermediate and final output fault lists 300. For the purpose of receiving and transmitting fault numbers 310, the stack memories 203 and 204 are connected to the DATA bus. As fault numbers 310 of an input fault list 300 are loaded into the list processor 110 and values of corresponding bit locations 210 are changed in response thereto in the characteristic vector registers 201 and 202, the input fault numbers 310 are also pushed onto stack A memory 203 under certain conditions that depend on the type of operation bein9 performed. Later, usin9 the bit map of locations 210 set in the characteristic vector re9isters 201 and 202, fault numbers 310 are removed from the stack A memory 203, and selectively stored in the stack B memory 204, to 9enerate the output fault list 300. Transfers of fault numbers 310 between the memories 203 and 204 are controlled by associated control lo9ic.

Each stack memory has control lo9ic, includin9 a stack pointer, associated therewith. Stack pointers SPA 211 and SPB 212 point to the next available entry in the stack memories 203 and 204, respectively. The remaining control logic 205 and 206 for each stack memory 203 and 204, respectively, controls the pushing and popping of fault numbers 310 onto and off of the associated stack memory. The stack A control logic 205 receives push and pop commands over control signal lines LOADA and UNLOADA, respectively. The stack B control logic 205 receives push and pop commands over control signal lines LOADB and UNLOADB. These control signal lines are asserted on a per-fault-list basis.

The control logic 205 and 206 are also connected to the BIT VALUE and ENABLE control signal lines. The bit value $v_i^-$ displayed on the BIT VALUE signal line is used in conjunction with the LOADA and LOADB signals selectively to push fault numbers onto the stack memories 203 and 204, respectively, when the ENABLE line is pulsed. While receiving a load signal on the LOADA line and upon receipt of an enable pulse, the control logic 205 checks the bit value appearing on the BIT VALUE signal line: if the value is logical zero, the control logic 205 pushes a fault number 310 from the DATA bus onto the stack A memory 203. While receiving a load signal on the LOADB line and upon receipt of an enable pulse, the control logic 206 checks the bit value appearing on the BIT VALUE signal line: if the value is logical one, the control logic 206 pushes a fault number 310 from the DATA bus onto the stack B; memory 204.

While receiving an unload signal and upon receipt of an enable pulse, a control logic unconditionally pops a fault number entry from the associated stack memory and places it on the DATA bus.

Figure 7A:
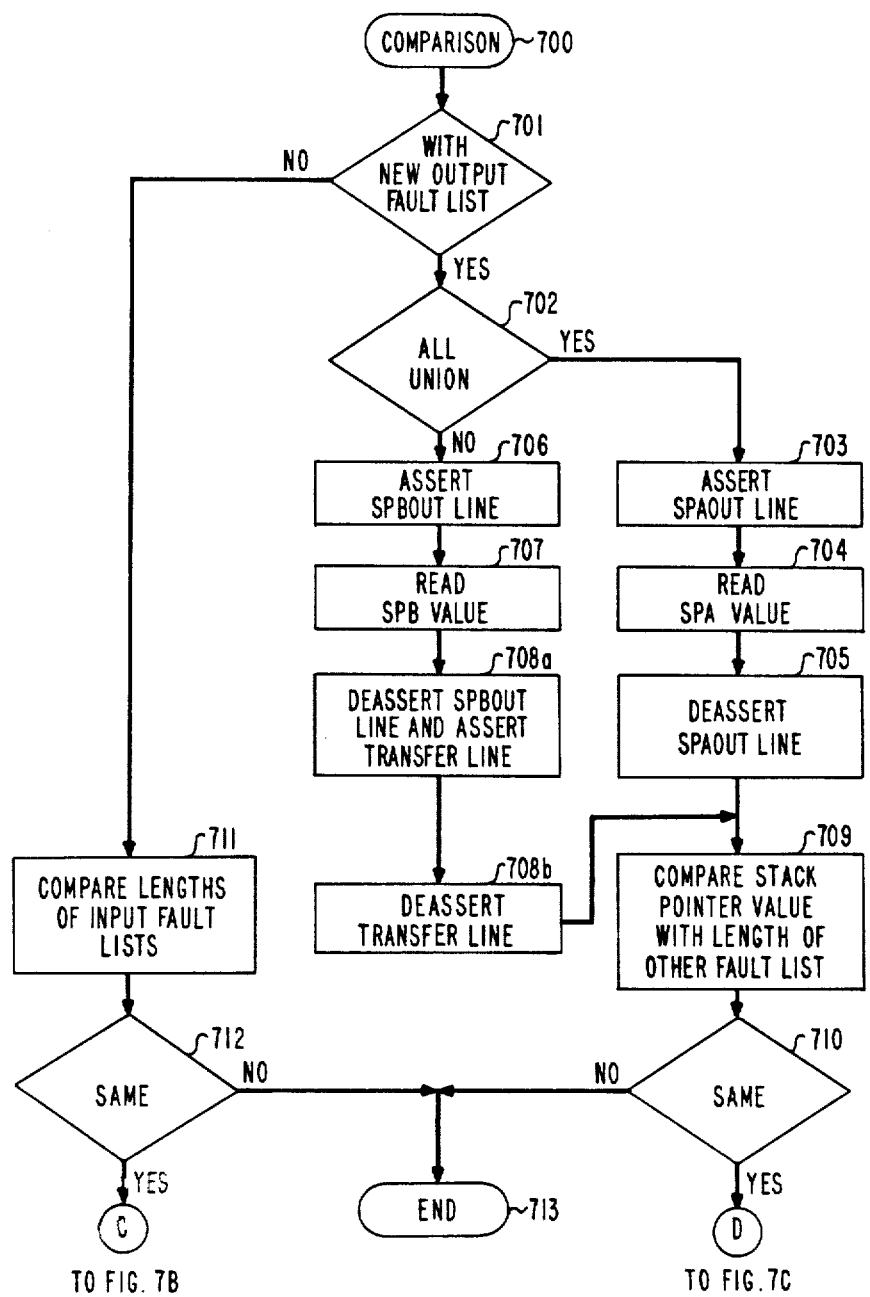
FIGS. 7A-C are a logical flow diagram of the comparison operation of the slave processor of FIG. 1.
Figure 7B:
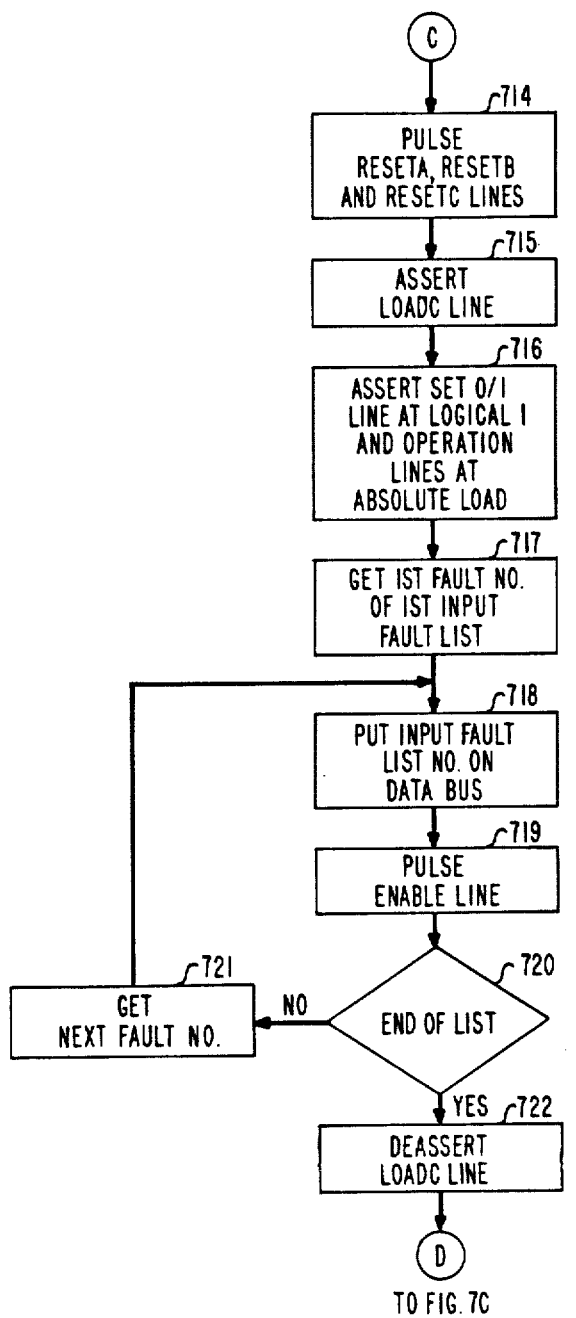
Figure 7C:
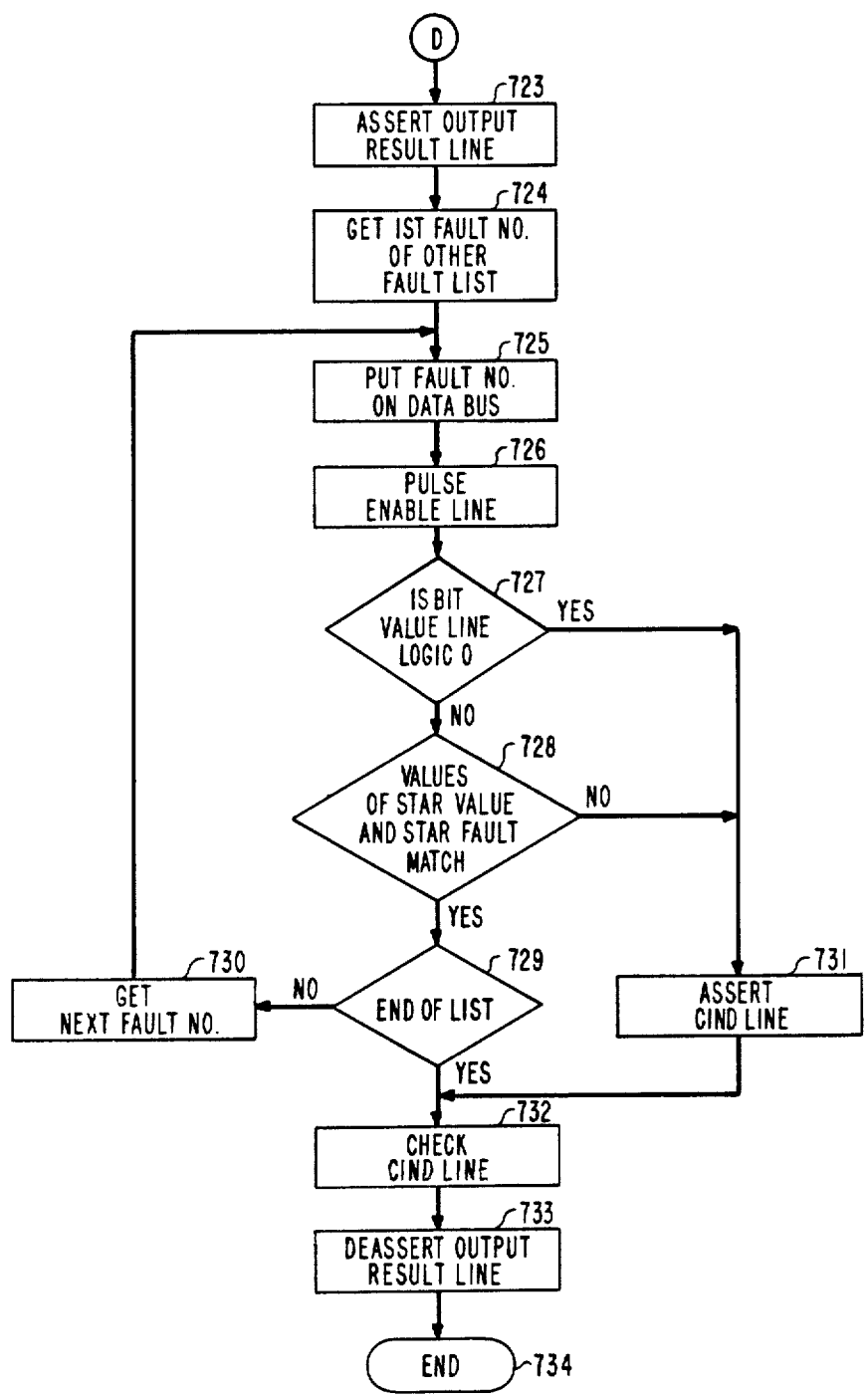

The list processor 110 also includes comparator logic 207 that is used in performing comparisons between fault lists 300. The comparator logic 207 determines whether two lists are the same by monitoring the signal values appearing on the BIT VALUE, STAR VALUE, and STAR FAULT signal lines, as described below in conjunction with FIG. 7. The comparator logic 207 is activated when it receives a signal on an OUTPUT RESULT signal line. The comparator logic 207 generates a signal on a "change indication" (CIND) signal line when it detects that the two lists being compared are different.

The list processor 110 operates as follows. Fault lists 300 are loaded one by one onto the list processor 110. Prior to loadin9 a fault list 300, the LOADA and LOADC lines are asserted and the states of the SET 0/1 and OPERATION si9nal lines are set to values that depend upon the type of operation bein9 performed and on whether the fault list 310 being loaded into the list processor 110 is the first list involved in the operation. The PU 106 then causes fault numbers 310 of an input fault list 300 to be loaded into the list processor 110 by causing fault numbers 310, along with their star fault designations, if any, to be put on the DATA bus and the ENABLE signal line to be pulsed. A fault number 310 that is put on the DATA bus addresses bit locations 210 in the registers 201, 202, and 213. The pulsing of the ENABLE line causes the addressed bit location 210 of the vector A register 201 to be set to a logical zero or one, depending on the state of the SET 0/1 line, which line is asserted on a per-fault list basis. The new, current, value of the addressed bit location is $v_i$. The previous value $v_i^-$ is displayed on the BIT VALUE line and is shifted into the corresponding bit location 210 of the vector B register 202. The old value of this bit location 210 in vector B register 202 is overwritten.

The pulsing of the ENABLE line also causes the value $v_i^*$ of addressed bit location 210 of the vector C register 213 to be displayed on the STAR VALUE line. Responding to assertion of the LOADC line, the star controller 214 takes its inputs from the STAR VALUE, BIT VALUE, STAR FAULT, and OPERATION signal lines. The star controller 214 then pulses high or low the SETC line, as appropriate. The pulsing of the SETC line causes the addressed bit location 210 of the vector C register 201 to be set to a logical zero or one, depending on the state of that line, which is pulsed on a per-fault-number basis.

The LOADA signal is used in conjunction with the enable signal and the value $v_i^-$ to push the fault number 310 onto the stack A memory 203. Fault numbers 310 are loaded in the stack A memory 203 if the value $v_i^-$ is a logical zero, the LOADA line is asserted, and the ENABLE line is pulsed. The LOADA line is asserted on a per-fault-list basis, and the ENABLE line is pulsed on a per-fault-number basis.

After loading a fault list 300, the bit map of the vector B register 202 is selectively transferred to the vector A register 201 by asserting and deasserting the TRANSFER line. This operation is required for the intersection operation. Furthermore, after entry of a second and each subsequent list in the list processor 110, the operation being performed between the partial result and the following input list or lists may be changed, by changing the states of the SET 0/1 and OPERATION lines appropriately.

After the fault numbers 310 from all input fault lists 300 have been loaded into the list processor 110, vector A register 201 includes a bit map of the output fault list 300 and vector C register 213 includes a bit map of the star faults of the output fault list 300. Bit locations 210 set to logical one in the registers 201 and 213 correspond to fault numbers 310 and their star fault designations, respectively, that may appear in the output fault list 300. The stack A memory 203 contains the output fault list 300 in the case where only the union operation has been performed on input lists, and it contains a superset of the output fault list 300 for the intersection and difference operations and for combinations of the union, intersection, and difference operations. In the latter case, the bit map of the vector A register 201 is then used to generate the output fault list 300 in the stack B memory 204, as follows.

After all fault numbers 310 have been loaded in the list processor 110, the LOADC line is deasserted and the UNLOADA and LOADB signal lines are asserted by the PU 106. Subsequent pulsing of the ENABLE signal line causes a fault number 310 to be popped from the top of the stack A memory 203 and put on the DATA bus. This fault number 310 addresses a bit location 210 in the vector A register 201. If the addressed bit value $v_i^-$ is a logical one, then the fault number 310 present on the DATA bus is pushed onto the stack B memory 204. The above cycle is repeated, by repeated pulsing of the ENABLE line, for all the fault numbers 310 present in the stack A memory 203 i.e., until the stack pointer SPA 211 is zero.

When all operations of the list processor 110 have been completed, the UNLOADA and UNLOADC signal lines are asserted for reading the output fault list 300 from the stack A memory 203 for the pure union operation, and the UNLOADB and UNLOADC signal lines are asserted for reading the output fault list 300 from stack B memory 204 for the intersection and difference operations, and for combinations of the intersection, difference, and union operations. The PU 106 asserts the SPAOUT signal line or the SPBOUT signal line to obtain the value of the stack pointer SPA 211 or SPB 212, respectively. After reading the stack pointer value, the PU 106 deasserts the asserted SPAOUT or SPBOUT line. The value of the stack pointer SPA 211 or SPB 212 give the length of the fault lists 300 in the stack A memory 203 or the stack B memory 204, respectively, and the PU 106 selectively uses this list length to make a comparison of the lengths of lists, and to DMA the output fault list 300 from the stack A memory 203 or the stack B memory 204 to the fault list memory 109.

Set operations that can be performed by using the list processor 110 are union of lists, intersection of lists, difference of lists, and comparison of lists. These operations will now be described in some detail.

Union of Fault Lists

The logical procedure for forming a union of fault lists is as follows. If the union is not with a partial result, the vector A is reset, i.e., zeroed out. If the union is with a partial result, or followin9 resettin9 of the vector A, for each fault number of each input fault list, if the corresponding bit location in vector A is zero, the bit location in vector A is set to one and the fault number is pushed onto the stack A. At the completion of this operation, the fault numbers present in the stack A are the output fault list or a superset of the fault list, depending upon whether or not only the union operation was performed in forming the output fault list.

When performing the union operation, an output fault number 310 is a star fault only if each occurrence of the fault is a star fault. Otherwise, the output fault number 310 is not a star fault. If the union is not formed with a partial result, the vector C is reset. If the union is formed with a partial result, or following resetting of the vector C, for each fault number of each input fault list, if the input fault is a star fault and the corresponding bit location in vector C is one, or if the input fault is a star fault and the previous value of the corresponding bit location in vector A was zero, the corresponding bit location in vector C is set to one. Otherwise the corresponding location in vector C is set to zero. At the completion of this operation, the bit locations in vector C set to one represent star faults of the output fault list or its superset.

The functional steps for performing the union operation by using the list processor 110 are shown in FIG. 4. When a union operation is to be performed by the PU 106, at block 400, the PU 106 first decides if the union involves a partial result already entered, i.e., formed and stored, in the list processor 110, at block 401. If not, the PU 106 pulses, i.e., momentarily asserts, the RESETA, RESETB, and RESETC signal lines, at block 402, to clear, i.e., zero out, the vector registers 201, 202 and 213, by sending the appropriate control words on the ADDRESS bus to the control decoder 111. In either case, the PU 106 then asserts the LOADA and LOADC signal lines, at block 403, in like manner. Because a union operation is indicated, the PU 106 sets the value of the SET 0/1 signal line to the logical one state, and sets the values of the OPERATION lines to indicate a union operation, at block 404, again by sending the appropriate control word to the control decoder 111.

At this point the PU 106 transfers operations to the DMA unit 108. The PU 106 sends to the DMA unit 108 the source address in the FLMEM 109 of the first input fault list 300, its length, the destination address of the vector A register 201, and a start command.

The DMA unit 108 responds by retrieving from the FLMEM 109 the first fault number 310, including its star fault designation, if any, of the first input fault list 300, at block 405, and placing it on the DATA bus, at block 406. The DMA unit 108 then pulses the ENABLE signal line, at block 407, by sending the appropriate control word to the control decoder 111.

This results in the bit location 210 of the vector A register 201 that is addressed by the fault number 310 present on the DATA bus being set to a logical one value. The former logical value of the bit location 210 of the vector A register 201 is transferred to the corresponding bit location 210 of the vector B register 202, and the transferred value is also displayed on the BIT VALUE line. Since the LOADA signal line is asserted, if the value on the BIT VALUE line is zero, the control logic 205 responds to pulsing of the ENABLE line by taking the fault number 310 from the DATA bus and pushing it onto the stack A memory 203. After pushing a fault number 310 on the stack A memory 203, the control logic 205 increments the SPA 211 by one.

Pulsing of the enable line also results in the value of the bit location 210 of the vector C register 213 that is addressed by the fault number 310 present on the DATA bus being displayed on the STAR VALUE line. Since the LOADC line is asserted and the OPERATION lines indicate a union operation, the star controller 214 takes its inputs from the STAR VALUE, BIT VALUE, STAR FAULT, and OPERATION lines, and asserts the SETC 0/1 line at the proper state on the basis thereof. Assertion of the SETC line results in the value of the bit location 210 of the vector C register 213 that is addressed by the fault number 310 present on the DATA bus being set at the state designated by the SETC line.

If the DMA unit 108 has not yet transferred the last fault number 310 of the input fault list 300 that it is currently transferring to the list processor 110, as determined at block 408, the DMA unit 108 retrieves from the FLMEM 109 the next fault number 310 of that input fault list 300, at block 409, and repeats the steps at the blocks 406-407 to load that fault number into the list processor 110. The DMA unit 108 then repeats the check of the block 408.

When the DMA unit 108 finishes transferring an input fault list 300 to the list processor 110, at the block 408, it issues an interrupt to the PU 106. The PU 106 responds by checking whether all fault lists 300 whose union is to be formed have been transferred to the list processor 110, at block 410. If not, the PU 106 commands the DMA unit 108, in the manner described before, to transfer the next input fault list 300. The DMA unit 108 responds by getting the first fault number 310 of this next list 300 from the FLMEM 109, at block 411, and transferring it to the list processor 110, at the blocks 406-407, in the manner described above. The DMA unit 108 repeats the activities of blocks 406-409 until this next fault list 300 has been transferred.

Each unique fault number 310 in the input fault lists 300 will be loaded only once into the stack A memory 203. A fault number 310 is loaded into the stack A memory 203 only if the value $v_i^-$ appearing on the BIT VALUE line is a logical 0. If a fault number 310 appears more than once in the input fault lists 300, the value $v_i^-$ is a logical 1 after the first appearance. Therefore, the fault number 310 is not loaded into the stack A memory 203 again.

When the PU 106 determines that all input fault lists 300 whose union is to be formed have been transferred to the list processor 110, at the block 410, it deasserts the LOADA and LOADC lines, at block 412, again by sending appropriate control words to the control decoder 111, and the union operation ends, at block 413.

Further activities undertaken by the PU 106 depend on whether the union operation was the last operation required to obtain a desired result, or if further operations must be performed using the partial result now stored in the list processor 110. If further operations must be performed, the PU 106 undertakes them. If the union operation was the last required operation, the PU 106 undertakes necessary activities to form and retrieve the output fault list. These activities are diagramed in FIG. 8.

As FIG. 8 shows, upon determining to form and retrieve the output fault lists, at block 800, the PU 106 asserts the SPAOUT signal line, at block 801, again by sending the appropriate control word to the control decoder 111, to obtain the value of the SPA 211.

In response to the SPAOUT signal, the control logic 205 outputs the contents of the SPA 211 on the DATA bus. The SPA 211 specifies the number of fault number entries in the stack A memory 203. The PU 106 retrieves the contents of the SPA 211 from the DATA bus, at block 802. Then the PU 106 deasserts the SPA-OUT line and asserts the UNLOADA line, at block 803, again by sending appropriate control words to the control decoder 111.

Further activities of the PU 106 depend cn whether or not the output fault list is formed as a result of only the union operation, as suggested in block 804.

If the output fault list was not formed as a result of only the union operation, as determined at block 804, the stack A memory 203 stores a superset of fault numbers 310 of the output fault list 300. Hence, before causing the output fault list to be stored in the FLMEM 109, the PU 106 must first form the output fault list from the superset. This condition is discussed below in conjunction with the intersection operation.

If, however, the output fault list was formed as as result of only the union operation, the stack A memory 203 stores the output fault list. The PU asserts the UN-LOADC line, at block 805, to enable retrieval of star fault designations from the vector C register 213.

The star controller 214 responds to assertion of the UNLOADC line by connecting the STAR VALUE line to the STAR FAULT line of the data bus. The star controller 214 also asserts the DISABLEC line and hence does not change the values of the vector C register 213.

Next, the PU 106 sends the retrieved contents of the SPA 211, along with the source address of the stack A register 203, the destination address in the FLMEM 109, and a start signal, to the DMA unit 108 to cause it to transfer the output fault list 300 from the stack. A memory 203, along with the proper star fault designation from the vector C register 213, to the designated location in the FLMEM 109.

The DMA unit 108 responds to the PU 106 by pulsing the ENABLE signal line, at block 805, again by sending the appropriate control word to the control decoder 111. The control logic 205 responds to the enable signal by popping a fault number 310 from the top of the stack A memory 203 and placing it on the DATA bus. The control logic 205 then decrements the value of the SPA 211 by one.

Note that the stack pointer SPA 211 does not require any special initialization. The value of SPA 211 is zero before the first fault number 310 is pushed onto the stack A memory 203 when loading the list processor 110, and will be zero after the last fault number 310 is popped out when the output fault list 300 is read.

The vector C register 213 responds to the enable signal by placing the value of its bit location 210 addressed by the fault number 310 that appears on the DATA bus on the STAR VALUE line. As the STAR VALUE line is connected to the STAR FAULT line of the DATA bus, this value appears on the DATA bus along with the fault number 310 retrieved from the memory 203. The DMA retrieves the fault number 310 along with its star fault value from the DATA bus, at block 807, and stores it in the FLMEM 109.

If the DMA unit 108 has not yet transferred the last fault number 310 of the output fault list 300 to the FLMEM 109, as determined at block 808, the DMA unit 108 returns to the blocks 806-807 to retrieve and store the next fault number 310 of the output fault list 300. When the DMA unit 108 completes transfer of the output fault list 300 from the list processor 110, at block 808, it issues an interrupt to the PU 106 to notify it thereof. In response, the PU 106 deasserts the UN-LOADA and UNLOADC lines, at block 809, thereby completing the output fault list formation and transfer procedure, at block 820.

Intersection of Fault Lists

The lo9ical procedure for forming an intersection of fault lists is as follows. If the intersection is not with a partial result, both vectors A and B are reset. Then, for each fault number of the first input fault list, the corresponding bit location in vector A is set to one and the fault number is pushed onto the stack A. If the intersection is with a partial result, or following loading of the first list, for each fault number of the next input fault list, the value of the corresponding bit location of vector A is moved from vector A to vector B. Following this, the contents of the vector B are transferred to vector A and vector B is reset. The procedures described in the last two sentences above are repeated for each remaining input fault list. This results in setting to 0 the bit locations of vector A that are not associated with the fault numbers of each of the remaining input fault lists. Thereafter, for each fault number in stack A, if the corresponding bit location in vector A is set to 1, the fault number is pushed onto stack B. At the completion of this operation, the fault numbers present in the stack B are the output fault list.

When performing the intersection operation, an output fault number 310 is a star fault if all the lists contain the fault and at least one of the input faults is a star fault. If the intersection is not formed with a partial result, the vector C is reset. Then, for each fault number of the first input fault list, the corresponding bit location in vector C is set to one if the fault number is a star fault; otherwise the value of the location is not changed. If the intersection is formed with a partial result, or following loading of the first list, for each fault number of each subsequent input fault list, either if the input fault is a star fault and the previous value of the corresponding bit location in vector A was one, or if the value of the corresponding bit location in vector C is one, this corresponding location in vector C is set to one. Otherwise the corresponding location in vector C is set to zero. At the completion of the operation, the bit locations in vector C set to one represent star fault designations of the fault numbers of the superset of the output fault list.

Figure 5A:
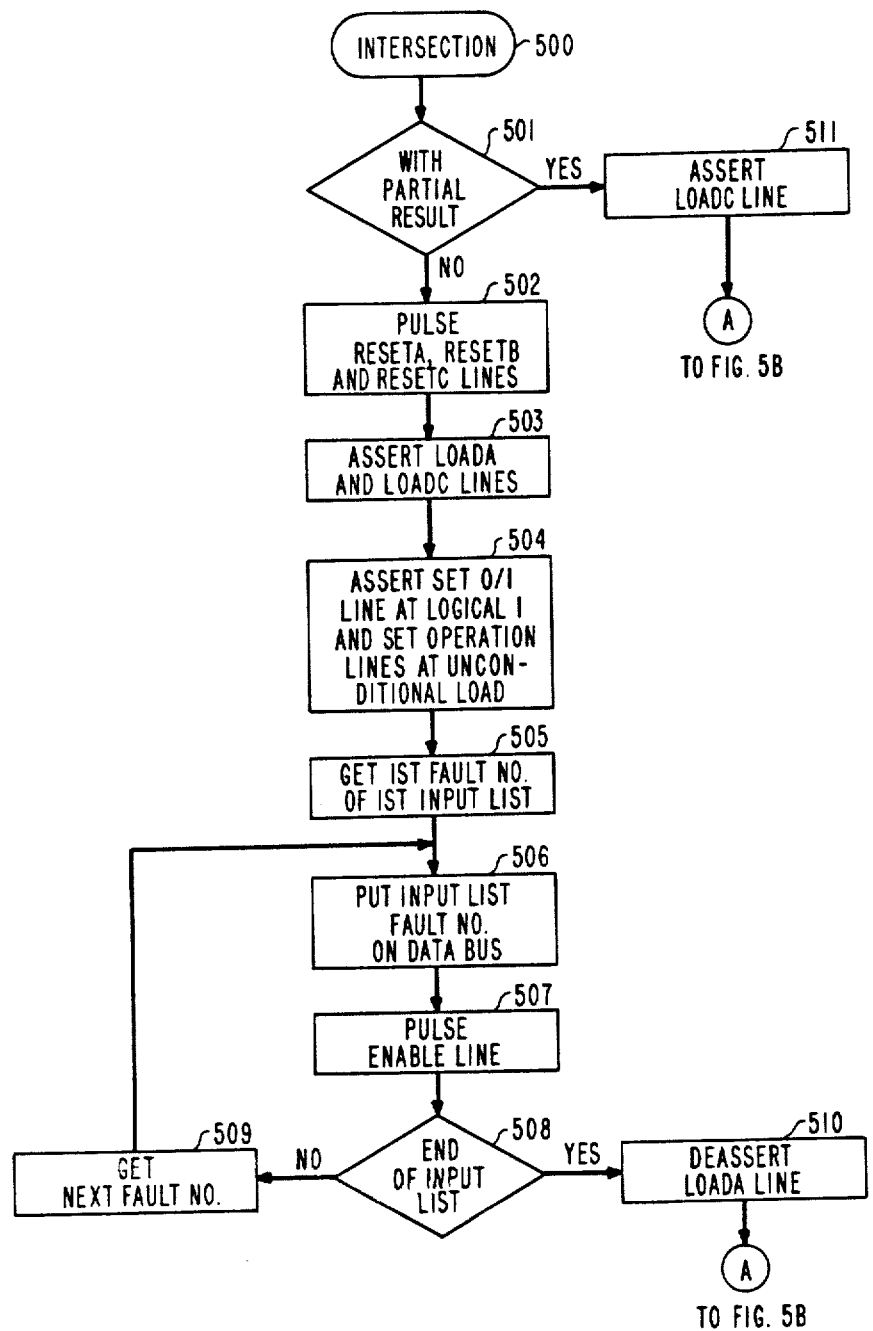
FIGS. 5A-B are a logical flow diagram of the intersection operation of the slave processor of FIG. 1.
Figure 5B:
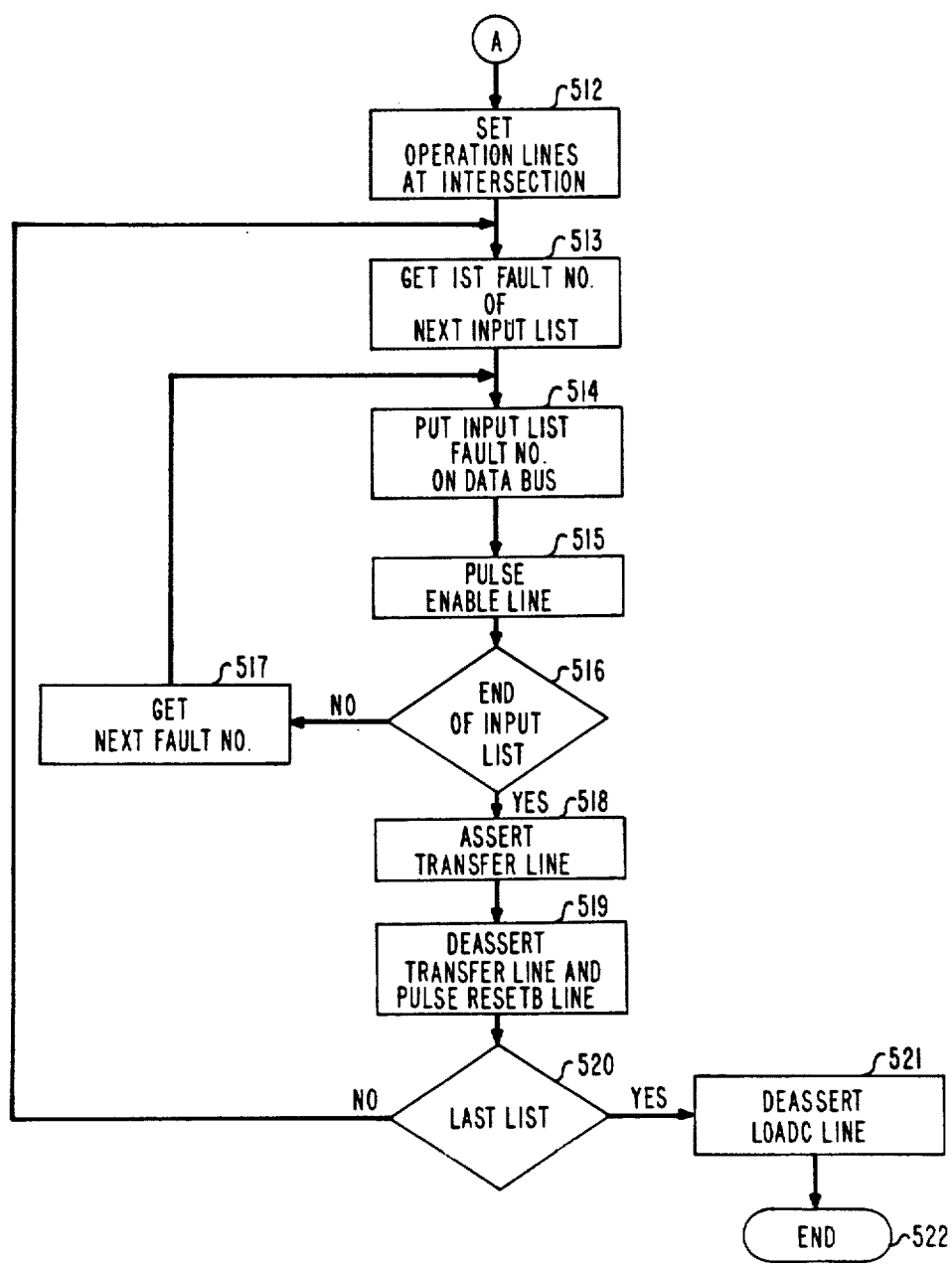

The functional steps for performing the intersection operation by using the list processor 110 are shown in FIG. 5. When an intersection operation is to be performed by the PU 106, at block 500, the PU 106 responds by determining whether a partial result is involved in the operation. If not, the PU 106 pulses the RESETA, RESETB, and RESETC lines, at block 502, to clear the vector registers 201, 202, and 203. The PU 106 also asserts the LOADA and LOADC lines, at block 503, to enable the loading of fault numbers into the stack A memory 203 and the loading of star fault designations into the vector C register 213. Because an intersection operation is indicated, the PU 106 sets the value of the SET 0/1 signal line to the logical one state, at block 504. And because the first list involved in the intersection operation is being entered in the list processor 110, the PU 106 sets the value of the OPERATION lines to indicate unconditional load, also at the block 504.

Setting of the OPERATION lines to an unconditional load state while the LOADC line is asserted cause the star controller 214, to effectively "connect" the SETC 0/1 line to the STAR FAULT line of the DATA bus: when the STAR FAULT line is asserted to indicate that the accompanying fault number is a star fault, the star controller 214 asserts high the SETC 0/1 line, to cause the corresponding bit location 210 of the vector C register 213 to be set to one; when the STAR FAULT line is not asserted, the star controller does not assert the SETC 0/1 line.

The PU 106 then causes the first input fault list 300 to be loaded into the list processor 110, as shown in blocks 505-509. These blocks correspond to the blocks 405-409 of FIG. 4, and the description thereof applies herein as well.

When the PU 106 receives an interrupt, at block 508, from the DMA unit 108 signifying completion of transfer of the first fault list 300 to the list processor 110, it responds by deasserting the LOADA line, at block 510, by sending the appropriate control word to the control decoder 111.

If the intersection operation involves a partial result, as determined at the block 501, the PU 106 asserts the LOADC line, at block 511, and then commences the operation at this point. The PU 106 sets the value of the OPERATION lines to indicate an intersection operation, at block 512. While in the example of FIG. 5, the SET 0/1 line remains set to the logical one state, alternatively the SET 0/1 line could be set at this point to the logical zero state. The PU 106 then causes the DMA unit 108 to transfer the next input fault list 300 to the list processor 110, at blocks 513-517, in the same manner as was shown in the blocks 505-509. The values of the registers 201, 202, and 213 are changed accordingly in response to receipt of the fault numbers of this list. In particular, because the OPERATION lines indicate an intersection operation, the star controller 214 takes its inputs from the STAR VALUE, BIT VALUE, STAR FAULT, and OPERATION lines, and asserts the SETC 0/1 line at the proper state on the basis thereof. However, because the LOADA signal line is deasserted, none of the fault numbers 310 of this fault list 300 are being stored in the stack A memory 203.

When the PU 106 receives an interrupt, at block 516, from the DMA unit 108 signifying completion of transfer of the next fault list 300 to the list processor 110, it responds by asserting the TRANSFER line, at block 518. This causes the bit values of all bit locations 210 of the vector B register 202 to be transferred into and stored in the corresponding bit locations 210 of the vector A register 201. The PL 106 then deasserts the TRANSFER line, and pulses the RESETB signal line, at block 519, to clear the vector B register 202. The contents of the vector C register 213 remain unaffected by the operations of the blocks 518 and 519.

Next, the PU 106 checks whether all lists 300 whose intersection is to be performed have been transferred to the list processor 110, at block 520. If not, the PU 106 causes the DMA unit 108 to again access the next input fault list 300, at the block 513, and to transfer it to the list processor, at the blocks 514-517, in the manner described before. And when the PU 106 is notified by an interrupt, at the block 516, of the completion of this transfer, it again performs the activities at the blocks 518-520.

The PU 106 repeats the activities of the blocks 513-520 until it determines, at block 520, that all input fault lists 300 whose intersection is to be formed have been transferred to the list processor 110. The PU 106 then deasserts the LOADC line, at block 521, again by sending an appropriate control word to the control decoder 111, and the intersection operation ends, at block 522.

Further activities undertaken by the PU 106 depend on whether the intersection operation was the last operation required to obtain a desired result, or if further operations must be performed using the partial result now stored in the list processor 110. If further operations must be performed, the PU 106 undertakes them. If the intersection operation was the last required operation, the PU 106 undertakes necessary activities to form and retrieve the output fault list. These activities are again diagramed in FIG. 8.

As FIG. 8 shows, upon determining to form and retrieve the output fault list, at block 800, the PU 106 performs the previously-described activities of the blocks 801–803 to obtain the value of the SPA 211 and to enable unloading of the stack A memory 203. Further activities of the PU 106 depend on whether or not the output fault list is formed as a result of only the union operation, as suggested in the block 804. If not, the stack A memory 203 stores a superset of the output fault list, and the PU 106 undertakes to form the output fault list therefrom.

The PU 106 asserts the LOADB line, at block 810, to enable the loading of the stack B memory 204 from the DATA bus. The PU 106 then pulses the ENABLE line, at block 811, once for each fault number 310 stored in the stack A memory 203 until the memory 203 is emptied, as suggested in block 812.

With the UNLOADA line asserted, the control logic 205 responds to each pulse on the ENABLE line by popping a fault number 310 from the top of the stack A memory 203 and placing it on the DATA bus. The control logic 205 also decrements the value of the SPA 211 by one for each enable pulse.

Each pulse of the ENABLE line also causes the bit location in the vector A register 201 that is associated with the fault number 310 that was placed by the stack A memory 203 on the DATA bus to be addressed, and causes its bit to be transferred to the vector B register 202 and to be displayed on the BIT VALUE signal line. Since the LOADB signal line is asserted, the control logic 206 is responsive to the signals on the BIT VALUE signal line. With the LOADB signal line asserted, the control logic 206 responds to each logical one signal appearing on the BIT VALUE line while the ENABLE line is pulsed by taking the fault number 310 from the DATA bus and pushing it on the stack B memory 204. In conjunction therewith, the control logic 206 also increments the SPB 212 by one.

Because the LOADC and UNLOADC lines are deasserted, the register 213 is not affected by these activities.

When it has emptied the stack A memory 203 of its fault number 310 entries, at block 812, the PU 106 deasserts the UNLOADA and LOADB line, at block 813, to terminate the memory 203-to-memory 204 transfer. At the block 813, the PU 106 also pulses the SPBOUT signal line to determine the length of the output fault list 300.

In response to the SPBOUT signal, the control logic 206 outputs the contents of the SPB 212 on the DATA bus. The SPB 212 specifies the number of fault number entries in the stack B memory 204. The PU 106 retrieves the contents of the SPB 212 from the DATA bus, at block 814. Then the PU 106 deasserts the SPBOUT line and asserts the UNLOADB and UNLOADC lines, at block 815, to enable retrieval of fault numbers and star fault designations from the stack B memory 204 and the vector C register 213, respectively. The star controller 214 responds to assertion of the UNLOADC line in the manner described above for block 805.

Next, the PU 106 sends the retrieved contents of the SPB 212, along with the source address of the stack B memory 204, the destination address in the FLMEM 109, and a start signal, to the DMA unit 108 to cause it to transfer the output fault list 300 from the stack B memory 204, along with the proper star fault designations from the vector C register 213, to the designated location in the FLMEM 109.

The DMA unit 108 responds to the PU 106 by performing the requested transfer from the stack B memory 204, at blocks 816–818, in a manner directly analogous to that described for blocks 806–808, the difference being that retrieval of fault numbers 310 is from the stack B memory 204 and not from the stack A memory 203. As in the case of the stack pointer SPA 211, the stack pointer SPB 212 does not require any special initialization. The value of the SPB 212 is zero before the first fault number 310 is pushed onto the stack B memory 204 from the stack A memory 203. This value will also be zero after the last fault number 310 is popped out when the output fault list 300 is read.

When the DMA unit 108 completes the transfer of the output fault list 300 from the list processor 110, at block 818, it issues an interrupt to the PU 106 to notify it thereof. In response, the PU 106 deasserts the UNLOADB and UNLOADC lines, at block 819, thereby completing the output fault list formation and transfer procedure, at block 820.

DIFFERENCE OF FAULT LISTS

The logical procedure for forming a difference of fault lists is as follows. If the difference is not with a partial result, the vector A is reset. Then, for each fault number of the first input fault list, the corresponding bit location in vector A is set to one and the fault number is pushed onto the stack A. The partial result, or first fault list when no partial result is involved, is the one from which other fault lists are logically "subtracted". If the difference is with a partial result, or following the loading of the first list, for each fault number of each remaining input fault list, the corresponding bit location of vector A is generally reset to zero. The exception to this rule is in the case of star faults. If a fault number 310 from the remaining lists 300 is a star fault, then the fault number 310 is not loaded in vector A for resetting the corresponding bit location 210 there. Thereafter, for each fault number in stack A, if the corresponding bit location in vector A is set to one, the fault number is pushed onto stack B. At the completion of this operation, the fault numbers present in the stack B are the output fault list.

When performing the difference operation, an output fault number 310 is present as a star fault if: (a) the fault number 310 appeared as a star fault in the list 300 from which values are being logically "subtracted" and the logically "subtracted" values do not contain the fault number 310 in the non-star fault form (i.e., $\{v^*\}-\{\ \}=\{v^*\}$ and $\{v^*\}-\{v^*\}=\{v^*\}$), or (b) the fault number 310 appeared as a non-star fault in the list 300 from which values are being logically "subtracted" and the value being logically "subtracted" is a star fault (i.e., $\{v\}-\{v^*\}=\{v^*\}$). If the difference is not formed with a partial result, the vector C is reset. Then, for each fault number of the first input fault list, the corresponding bit location in vector C is set to one if the fault number is a star fault; otherwise the value of the location is not changed. If the difference is formed with a partial result, or following loading of the first list, for each fault number of each subsequent input fault list, if the input fault is a star fault and the previous value of the corresponding bit location in vector A was one, the corresponding bit location in vector C is set to one. Otherwise, the corresponding bit location in vector C is set to zero. At the completion of this operation, the bit locations in vector C that are set to one represent star faults of the output fault list.

The functional steps for performing the difference operation by using the list processor 110 are shown in FIG. 6. When a difference operation is to be performed by the PU 106, at block 600, the PU 106 responds by determining whether a partial result is involved in the operation. If not, the PU 106 pulses the RESETA, RESETB, and RESETC lines, at block 602, to clear the vector registers 201, 202, and 203. The PU 106 also asserts the LOADA and LOADC lines, at block 603, to enable the loading of faults numbers into the stack A memory 203 and the loadin9 of star fault designations into the vector C register 213. Because the difference operation is indicated, the PU 106 sets the value of the SET 0/1 signal line to the logical one state, at block 604. And because the first list involved in the difference operation is being entered in the list processor 110, the PU 106 sets the value of the OPERATION lines to indicate unconditional load, also at the block 604. This setting of the OPERATION line will again cause the star controller 214 to effectively "connect" the SETC 0/1 line to the STAR FAULT line, as was described for block 504 of FIG. 5.

The PU 106 then causes the first input fault list 300 to be loaded into the list processor 110, as shown in blocks 604–609. These blocks correspond to the blocks 405–409 of FIG. 4, and the description thereof applies herein as well.

When the PU 106 receives an interrupt, at block 608, from the DMA unit 108 signifying completion of transfer of the first fault list 300 to the list processor 110, it responds by deasserting the LOADA line, at block 610.

If the difference operation involves a partial result, as determined at the block 601, or following block 610, the PU 106 asserts the LOADC line, at block 611, and then commences the operation at this point. The PU 106 then sets the SET 0/1 line to the logical 0 state, at block 612, by sending the appropriate control word to the control decoder 111. This state of the SET 0/1 line will cause bit locations 210 in the vector A register 201 addressed over the DATA bus to assume a logical zero value. Also at the block 612, the PU 106 sets the value of the OPERATION lines to indicate a difference operation. Next, the PU 106 causes the DMA unit 108 to transfer the remaining fault lists 300 to the list processor 110, at blocks 613–618, following a procedure substantially as described for the blocks 406–411 of FIG. 4. However, because the LOADA signal line is deasserted, none of the fault numbers 310 of these fault lists 300 are being stored in the stack A memory 203. And since the SET 0/1 line is set to the zero state, addressed locations are being set to logical zero value in the vector A register 201.

Because the OPERATION lines indicate a difference operation, the star controller 214 takes its inputs from the STAR VALUE, BIT VALUE, STAR FAULT, and OPERATION lines, and asserts the SETC 0/1 line at the proper state on the basis thereof. Furthermore, because the difference operation is indicated, the star controller 214 exerts control over enable pulses reaching the vector registers 201 and 202. For this purpose, the ENABLE line is logically ANDed, by the AND gate 215, with a DISABLEA line at the input to the registers 201 and 202. The DISABLEA line is connected to the star controller 214, and the controller 214 generally maintains the DISABLEA line asserted high so that enable pulses may reach the registers 201 and 202. While the OPERATION lines indicate the difference operation, however, whenever and while the star controller 214 senses a high signal on the STAR FAULT line, it asserts the DISABLEA line low to prevent an enable pulse from reaching the registers 201 and 202. In this manner, the star controller 214 prevents star faults of the remaining lists from being registered by the vectors A and B.

When the PU 106 determines, at block 618, that all input fault lists 300 have been transferred to the list processor 110, the PU 106 pulses the RESETB line to clear the vector B register 202, and deasserts the LOADC line, at block 619. The difference operation is thus concluded, at block 620.

Further activities undertaken by the PU 106 once again depend on whether the difference operation was the last operation required to obtain a desired result, or if further operations must be performed using the partial result now stored in the list processor 110. If further operations must be performed, the PU 106 undertakes necessary activities to form and retrieve the output fault list. These activities are diagramed in blocks 800–804 and 810–820 of FIG. 8 and are described above, in conjunction with the intersection operation.

Comparisons of Fault Lists

The logical procedure for comparing fault lists is as follows. First, a comparison is made of the length of the two fault lists that are to be compared. If they differ in length, i.e., in the number of fault numbers which they contain, the lists are obviously different and the comparison ends. If the length of both fault lists is the same, however, the fault numbers of the two fault lists must be compared.

Generally, though not always, the comparison operation is used in deductive simulation to compare a new output fault list 300—one generated from input fault lists 300 that have had fault numbers 310 injected therein or deleted therefrom—with a previous output fault list 300, to determine if there is a change. If a new output fault list stored in the first processor 110 is not involved in the comparison, vector A is reset. Then for each fault number of the first input fault list, the corresponding bit location in vector A is set to one. If the new output fault list is involved, or following loading of the first input list into the list processor 110, for each fault number of the second input fault list, the bit value of the corresponding bit location in vector A is checked to determine if it is one of the bit locations that was previously set to one. If not, i.e., a checked bit value is zero, then the lists are different. But if all the checked bit values are one, then the comparison of the star fault designations determines whether the compared lists are the same.

When performing the comparison operation, the star fault designations of the fault numbers being compared must also be the same for the fault lists to be considered the same. If the comparison is not being made with the new output fault list, vector C is reset. Then for each fault number of the first input fault list, the corresponding bit location in vector C is set to one if the input fault is a star fault. If the comparison is being made with the new output fault list, or following loading of the first input list into the list processor 110, for each fault number of the second input fault list, the bit value of the corresponding bit location in vector C is checked to determine if its value matches that of the star fault bit of the input fault. If there is a mismatch, the lists are different.

The functional steps for performing the comparison operation by using the list processor 110 are shown in FIG. 7.

When the comparison involves the new output fault list 300, the list length of the new output fault list 300 is available from the value of the SPA 211 or the SPB 212, depending on whether or not the new output fault list 300 was formed as a result of only the union operation. Hence, when a comparison operation is to be performed by the PU 106, at block 700, the PU 106 first determines whether the comparison is of some fault list 300 with the list processor's new output fault list 300, at block 701.

If so, the list length of the output fault list 300 is indicated by a stack pointer, and the PU 106 determines what were the list operations performed by the list processor 110 in forming the output fault list 300, at block 702. If the output fault list 300 was formed as a result of only union operations, the new output fault list length is indicated by the SPA 211, and the PU 106 asserts the SPAOUT signal line, at block 703, to obtain the value of the SPA 211 on the DATA bus, at block 704, and then deasserts the SPAOUT line, at block 705. If the list operations were not solely union operations, the new output fault list length is indicated by the SPB 212, and the PU 106 asserts the SPBOUT signal line, at block 706, to obtain the value of the SPB 212 on the DATA bus, at block 707, and then deasserts the SPBOUT line, at block 708a.

Also at the block 708a, the PU 106 asserts the TRANSFER line to transfer the contents of the vector B register 202 into the vector A register, because the bit map of the output fault list 300 had been shifted to the vector B register 202 during formation of the output fault list in the stack B memory 204. Following the transfer, the PU 106 deasserts the TRANSFER line, at block 708b.

Having obtained the stack pointer that indicates the new output fault list length, the PU 106 obtains the list length of the other fault list 300 being compared with the new output fault list 300 and compares their lengths, at block 709. If the lengths are determined to be different, at block 710, then the lists 300 are different, and no more processing is necessary for the comparison operation. Hence the comparison is ended, at block 713.

If the comparison does not involve the new output fault list 300, as determined at the block 701, the PU 106 obtains the list lengths of the two fault lists 300 that are to be compared and compares the lengths, at block 711. If the lengths are determined to be different, at block 712, the lists are different and the comparison is ended, at the block 713.

If the lengths of the two fault lists 300 are the same, as determined at the blocks 710 or 712, the list processor 110 is used to perform the comparison operation. When the comparison involves the list processor's new output fault list 300, the new output fault list 300 does not have to be loaded again into the list processor 110. It is in there as a result of the operations already performed in forming it, which have the same effect in relevant aspects as loading the fault list 300 into the list processor 110. Hence, for purposes of this application, the operations involved in creating the output fault list are considered to load the output fault list into the list processor 110. Therefore only the second fault list 300 must thereafter be loaded into the list processor 110.

But if the comparison does not involve the new output fault list 300, both lists 300 that are being compared must now be loaded into the list processor 110. The PU 106 pulses the RESETA, RESETB and RESETC lines, at block 714, to clear the registers 201, 202, and 203. The PU 106 also asserts the LOADC line, at block 715, to enable the loading of star fault designations into the vector C register 213. And the PU 106 sets the SET 0/1 line to the logical one state and sets the OPERATION lines to indicate absolute load, at block 716. The PU 106 then causes the first list 300 to be loaded into the list processor 110, at blocks 717-720, in a manner analogous to that described for the blocks 405-409 of FIG. 4. The discussion thereof applies herein as well, the exceptions being that fault numbers need not be loaded into the stack A memory 203 and hence the LOADA line is not asserted, and that the OPERATION lines are set to indicate absolute load. When all fault numbers 310 of the first input fault list have been loaded into the list processor 110, as determined at the block 720, the PU 106 deasserts the LOADC line.

Henceforth, the comparison operation is the same whether or not it involves the new output fault list 300. At this juncture, the second fault list 300 to be compared must be loaded into the list processor 110. But first, the PU 106 also asserts the OUTPUT RESULT line, at block 723, to activate the comparator logic 207. While in the example of FIGS. 7A-C the SET 0/1 line remains set at the logical one state. Alternatively, the line may be set to the logical zero state at this point. Then the PU 106 causes the DMA unit 108 to load the second fault list 300 into the list processor 110, at blocks 724, 725, 726, 729, and 730. Once again, the procedure is analogous to that of the blocks 405 through 409 of FIG. 4.

Because both the LOADC and UNLOADC lines are deasserted, the star controller 214 is idle. But because the OUTPUT RESULT line is asserted, the comparator logic 207 monitors the BIT VALUE, STAR VALUE, and STAR FAULT signal lines during the transfer of the second fault list 300, at blocks 727 and 728. If a fault number 310 of the second fault list 300 is the same as a fault number 310 of the first fault list 300, the bit value of the bit location 210 of vector A register 201 addressed by the fault number 310 of the second fault list 300 is one; hence a logical one value is displayed on the BIT VALUE signal line and transferred thereby to the comparator logic 207. But if a fault number 310 of the second fault list 300 is different from fault numbers 310 of the first fault list 300, the bit value of the bit location 210 of vector A register 201 addressed by the fault number 310 of the second fault list 300 is zero, and hence a logical zero value is displayed on the BIT VALUE signal line and transferred thereby to the comparator logic 207.

Similarly, if the star fault designation of a fault number 310 of the second fault list 300 is the same as the star fault designation of the like fault number 310 of the first fault list 300, the bit value of the addressed location 210 of the vector C register 213 is the same as the star bit value appearing on the DATA bus; hence the same logical value is displayed on the STAR VALUE and STAR FAULT lines and transferred thereby to the comparator logic 207. But if the star fault designations of like fault numbers 310 of the first and second fault lists 300 differ, the STAR VALUE and STAR FAULT lines transfer different logical values to the comparator logic 207.

When the DMA unit 108 pulses the ENABLE signal line, at block 726, to load a fault number 310 of the second fault list 300 into the list processor 210, if the comparator logic 207 detects a logical zero value on the BIT VALUE line, at block 727, the two fault lists are different and in response the comparator logic 207 asserts the CIND line, at block 731, to transmit to the DMA unit 108 and to the PU 106 a signal indicative thereof.

If, however, the comparator logic 207 detects a logical one value on the BIT VALUE line, at the block 727, it also checks the STAR VALUE and STAR FAULT lines to determine if their values match, at block 728. If they do not match, the fault lists are different and the comparator logic 207 asserts the CIND line at the block 731.

The DMA unit 108 continues to load fault numbers 310 into the list processor 210 until it detects either the end of the input list, at the block 729, or assertion of the CIND line at the block 731. In response to either case, the DMA unit 108 ceases loading fault numbers 310 into the list processor 110 and sends an interrupt to the PU 106 to notify it that it has completed its activities.

In response, the PU 106 checks the CIND line, at block 732, to determine the result of the comparison. If the CIND line is not asserted, it serves as an indication to the PU 106 that the compared fault lists 300 are the same. The PU 106 may use the result of the comparison to determine if the new output fault list 300 is to be moved to the FLMEM 109. The PU 106 then deasserts the OUTPUT RESULT line, at block 733, to disable the comparator logic 207. Disabling of the comparator logic 207 also resets the CIND line to the logical zero state. The comparison operation then ends, at block 734.

Of course, various changes and modifications to the illustrative embodiment described above will be apparent to those skilled in the art. For example, the slave processor 100 and the list processor 110 are not limited in their application to fault simulation systems, but may be used with advantage in any application's that involve the processing of lists or the performance of set algebra. For example, database management and processing is one such application. The lists being processed need not be lists of fault numbers, but may be lists of anything, for example name lists, or address lists, or inventory lists. Or the slave processor 100 may be an independent, even a stand-alone, processor. Furthermore, the list processor 110 need not be a separate unit in the slave processor 100, but may form a part of the arithmetic and logic unit of the processing unit 106. And the functional elements of the list processor 110 may be configured in different hardware from that described herein. Also, signal logical levels may be changed, for example, to assert or set lines at the logical zero level and to deassert or reset lines at the logical one level. Such changes and modifications can be made without departing from the spirit and the scope of the invention and without diminishing its attendant advantages. It is therefore intended that such changes and modifications be covered by the following claims.

What is claimed is:

1. Method of generating a list representing union of a plurality of lists, in an apparatus comprising a memory and register means including a first register having a plurality of bits, each list having at least one element and each different element of the plurality of lists being mapped to a different bit of the first register and all same elements being mapped to a same bit of the first register, the method comprising the steps of:

(a) resetting the bits of the first register to clear the register;

(b) storing an element of the plurality of lists in the memory if the first register bit mapped to the element is not set;

(c) setting the first register bit mapped to the element; and (d) performing the steps (b) and (c) for each element of each list of the plurality of lists;

whereby the union list comprises the elements stored in memory.

2. The method of claim 1, in an apparatus wherein the register means further include a second register having a plurality of bits each forming with a bit of the first register a shift register pair for automatically storing the current and previous state of the bit of the first register, wherein the steps of setting and storing comprise the steps of:
setting the bit of the first register mapped to the element; and
storing the element in the memory if the second register bit of the shift register pair that includes the first register bit mapped to the element is not set.

3. Method of obtaining a list representing union of a plurality of lists, in an apparatus comprising memory means including a first and a second memory, and a first register having a plurality of bits, each list having at least one element and each different element of the plurality of lists being mapped to a different bit of the first register and all same elements being mapped to a same bit of the first register, the method comprising the steps of:

(a) resetting the bits of the first register to clear the register;

(b) storing an element of the plurality of lists in the first memory if the first register bit mapped to the element is not set;

(c) setting the first register bit mapped to the element;

(d) performing the steps of (b) and (c) for each element of each list of the plurality of lists; and (e) transferring from the first memory to the second memory those elements whose first register bits mapped to the elements are set;

whereby the union list comprises the elements stored in the second memory.

4. The method of claim 1, in an apparatus wherein list elements are of a first and a second type and wherein the register means further include a second-type-element register having a plurality of bits a different one mapped to each different element of the second type and all same elements of the second type being mapped to a same bit of the second-type-element register, wherein the step (a) is accompanied by the further step of
(i) resetting the bits of the second-type-element register to clear the register; wherein the step (c) is accompanied by the further steps of
(ii) setting the second-type-element register bit mapped to the element if the element is of the second type and either the second-type-element register bit mapped to the element is set or the first register bit mapped to the element is not set before step (c); and (iii) otherwise resetting the second-type-element register bit mapped to the element; and wherein the step (d) is accompanied by the further step of
(iv) performing the steps (ii) and (iii) for each element of each list of the plurality lists;

whereby elements stored in memory that have bits of the second-type-element register that are mapped to the elements set are second-type-elements of the union list.

5. The method of claim 4, in an apparatus wherein the register means further include a third register having a plurality of bits each forming with a bit of the first register a shift register pair for automatically storing the current and previous state of the bit of the first register, wherein the steps (b) and (c) together comprise the steps of setting the bit of the first register mapped to the element, and storing the element in the memory if the third register bit of the shift register pair that includes the first register bit mapped to the element is not set; and wherein the steps (ii) and (iii) together comprise the steps of setting the second-type-element register bit mapped to the element if the element is of the second type and either the second-type-element reigster bit mapped to the element is set or the third register bit mapped to the element is not set after step (c), and otherwise resetting the second-type-element register bit mapped to the element.

6. Method of generating a list representing intersection of a plurality of lists, in an apparatus comprising a first and a second memory, and register means including a first and a second register each having a plurality of bits, a pair of bits one from each register forming a shift register pair for automatically storing the current and previous state of the bit of the first register, each list having at least one element and each different element of the plurality of lists being mapped to the bits of a different shift register pair and all same elements being mapped to the bits of a same shift register pair, the method comprising the steps of:

(a) resetting the bits of the first and the second registars to clear the registers;

(b) setting the first register bit mapped to an element of a first list of the plurality of lists;

(c) storing the element in the first memory;

(d) performing the steps (b) and (c) for each element of the first list;

(e) setting or resetting the first register bits mapped to the elements of another list of the plurality of lists;

(f) transferring, within the shift register pairs, the states stored by the second register bits to the first register bits;

(g) resetting the bits of the second register;

(h) performing the steps (e) through (g) for each other list of the plurality of lists; and (i) transferring from the first memory to the second memory those elements whose first register bits mapped to the elements are set;

whereby the intersection list comprises the elements stored in the second memory.

7. The method of claim 6 wherein the step of transferring elements from the first to the second memory comprises the steps of:

(j) removing the element from the first memory;

(k) setting or resetting the first register bit mapped to the removed element;

(l) storing the removed element in the second memory if the second register bit mapped to the element is set; and (m) repeating steps (i) through (l) for each element stored in the first memory.

8. The method of claim 6, in an apparatus wherein the list elements are of a first and a second type and wherein the register means further include a third register having a plurality of bits a different one mapped to each different element of the second type and all the same elements of the second type being mapped to a same bit of the third register, wherein the step (a) is accompanied by the further step of (i) resetting the bits of the third register to clear the register; wherein the steps (b), (c), and (d) are accompanied by the further step of (ii) setting the third register bit mapped to the second-type elements of the first list; wherein the step (e) is accompanied by the further steps of (iii) setting the third register bit mapped to an element of the other list either if the third register bit mapped to the element is set or if the element is of the second type and the second register bit mapped to the element is set after step (c), (iv) otherwise resetting the third register bit mapped to the element, and (v) performing the steps (iii) and (iv) for each element of the other list; and wherein the step (h) is accompanied by the further step of (vi) performing the step (v) for each other list of the plurality of lists;

whereby elements stored in the second memory that have bits of the third register that are mapped to the elements set are second-type elements of the intersection list.

9. Method of generating a list representing difference of a plurality of lists, in an apparatus comprising a first and a second memory and register means including a first register having a plurality of bits, eac list having at least one element and each different element of the plurality of lists being mapped to a different bit of the first register and all same elements being mapped to a same bit of the first register, the method comprising the steps of:

(a) resetting the bits of the first register to clear the register;

(b) setting the first register bit mapped to an element of the first list of the plurality of lists;

(c) storing the element in the first memory;

(d) performing the steps (b) and (c) for each element of the first list;

(e) resetting the first register bits mapped to selected elements of the other lists of the plurality of lists; and (f) transferring from the first memory to the second memory those elements whose first register bits that are mapped to the elemants are set;

whereby the difference list comprises the elements stored in the second memory.

10. The method of claim 9, in an apparatus wherein the register means further include a second register having a plurality of bits each forming with a bit of the first register a shift register pair for automatically storing the current and previous state of the bit of the first register, wherein the step of transferring elements from the first to the second memory comprises the steps of:

(g) removing an element from the first memory;

(h) setting or resetting the first register bit mapped to the removed element;

(i) storing the removed element in the second memory if the second register bit of the shift register pair that includes the first register bit mapped to the element is set; and (j) repeating steps (g) through (i) for each element stored in the first memory.

11. The method of claim 9 wherein the step of resetting the first register bits mapped to selected elements comprises the step of:

resetting the first register bits mapped to all elements of the other lists of the plurality of lists.

12. The method of claim 9, in an apparatus wherein the list elements are of a first and a second type and wherein the register means further include a second-type-element register having a plurality of bits a different one mapped to each different element of the second type and all elements of the second type being mapped to a same bit of the second-type-element register, wherein the step (a) is accompanied by the further step of (i) resetting the bits of the second-type-element register to clear the register; wherein the steps (b), (c), and (d) are accompanied by the further step of (ii) setting the second-type-element register bits mapped to the second-type elements of the first list; wherein the step (e) comprises the step of resetting the first register bits mapped to first-type elements of the other lists of the plurality of lists; wherein the step (e) is accompanied by the further steps of (iii) setting the second-type-element register bit mapped to an element of the other lists if the element is of the second type and the first register bit mapped to the element is set, (iv) otherwise resetting the second-type-element register bit mapped to the element, and (v) performing the steps (iii) and (iv) for each element of the other lists;

whereby elements stored in the second memory that have bits of the second-type-element register that are mapped to the elements set are second-type elements of the difference list.

13. The method of claim 12, in an apparatus wherein the register means further include a third register having a plurality of bits each forming with a bit of the first register a shift register pair for automatically storing the current and previous state of the bit of the first register, wherein the steps (iii) and (iv) together comprise the steps of:

setting the second-type-element register bit mapped to an element of the other lists if the element is of the second type and the third register bit mapped to the element is set; and otherwise resetting the second type-element register bit mapped to the element.

14. Method of comparing two lists, in an apparatus comprising a first register having a plurality of bits and a second register having a plurality of bits each forming with a bit of the first register a shift register pair for automatically storing the current and previous state of the bit of the first register, each list having at least one element and each different element of the two lists being mapped to a different bit of the first register and all same elements being mapped to the same bit of the first register, the method comprising the steps of:

(a) resetting the bits of the first register to clear the register;

(b) setting the first register bits mapped to the elements of a first list of the two lists;

(c) setting or resetting the first register bit mapped to an element of the other list of the two lists;

(d) examining the second register bit of the shift register pair that includes the first register bit mapped to the element;

(e) generating an indication that the lists are different if the examined second register bit is not set; and (f) performing steps (c) through (e) for other elements of the other list if the indication is not generated.

15. Method of comparing two lists, in an apparatus wherein the list elements are of a first and a second type and comprising a first and a second register each having a plurality of bits, each list having at least one element and each different element of either type being mapped to a different bit of the first register and a different bit of the second register, and all same elements of either type being mapped to a same bit of the first register and a same bit of the second register, the method comprising the steps of:

(a) resetting the bits of the first and the second registers to clear the registers;

(b) setting the first register bits mapped to the elements of a first list of the two lists;

(c) setting the second register bits mapped to the second-type elements of the first list;

(d) examining the first register bit mapped to an element of the other list of the two lists;

(e) examining the second register bit mapped to the element of the other list;

(f) generating an indication that the lists are different either if (a) the examined first register bit is not set or if (b) the element is of the first type and the examined second register bit is set or if (c) the element is of the second type and the examined second register bit is not set; and (g) performing steps (d) through (f) for other elements of the other list if the indication is not generated.

16. Apparatus for generating a list representing union of a plurality of lists each having at least one element, comprising:

means for receiving list elements;

memory means;

first register means having a plurality of bits a different one mapped to each different element of the plurality of lists and all same elements being mapped to a same bit of the first register means;

means for resetting the bits of the first register means to clear the register means;

means cooperative with the receiving means for storing a received element in the memory means if the first register means bit mapped to the received element is not set; and means cooperative with the receiving means for setting the first register means bit mapped to the received element;

whereby the union list comprises the elements stored in the memory means.

17. The apparatus of claim 16 further comprising second register means having a plurality of bits each forming with a bit of the first register means a shift register pair each mapped to a different list element for automatically storing the current and previous state of the bit of the first register means, and means for resetting the bits of the second register means to clear the register means; wherein the element storing means comprise means cooperative with the receiving means and responsive to the setting means for storing the received element in the memory means if the second register means bit of the shift register pair mapped to the received element is not set.

18. Apparatus for obtaining a list representing union of a plurality of lists each having at least one element, comprising:

means for receiving list elements;
memory means;
first register means having a plurality of bits a different one mapped to each different element of the plurality of lists and all same elements being mapped to a same bit of the first register means;
means for resetting the bits of the first register means to clear the register means;
means cooperative with the receiving means for storing a received element in the memory means if the first register means bit mapped to the received element is not set;
means cooperative with the receiving means for setting the first register means bit mapped to the received element;
second memory means coupled to the first memory means; and
means for transferring from the first memory means to the second memory means elements mapped to set bits of the first register means;
whereby the union list comprises the elements stored in the second memory.

19. The apparatus of claim 16, wherein the list elements are of a first and a second type and wherein same elements of both types are mapped to a same bit of the first register means, further comprising:

second-type-element register means having a plurality of bits a different one mapped to each different element of the second type and all same elements of the second type being mapped to a same bit of the second-type-element register means;
means for resetting the bits of the second-type-element register means to clear the register means;
means cooperative with the receiving means for setting the second-type-element register means bit mapped to the received element if the element is of the second type and either the second-type-element register means bit mapped to the element is set or the first register means bit mapped to the element is not set and otherwise for resetting the second-type-element register means bit mapped to the element;
whereby elements stored in memory means that are mapped to set bits of the second-type-element register means are second-type elements of the union list.

20. The apparatus of claim 19 further comprising
third register means having a plurality of bits each forming with a bit of the first register means a shift register pair each mapped to a different list element for automatically storing the current and previous state of the bit of the first register means, and
means for resetting the bits of the third register means to clear the register means; wherein
the element storing means comprise
means cooperative with the receiving means and responsive to the setting means for storing the received element in the memory means if the third register means of the shift register pair mapped to the received element is not set; and wherein
the means for setting the second-type-element register means bit comprise
means cooperative with the receiving means for setting the second-type-element register means bit mapped to the received element if the received element is of the second type and either the second-type-element register means bit mapped to the element is set or the third register means bit mapped to the element is not set and otherwise for resetting the second-type-element register means bit mapped to the element.

21. Apparatus for generating a list representing intersection of a plurality of lists each having at least one element comprising:

means for receiving lists;
first and second memory means;
first register means having a plurality of bits a different one mapped to each different element of the plurality of lists and all same elements being mapped to a same bit of the first register means;
means for resetting the bits of the first register means to clear the register means;
second register means having a plurality of bits each forming with a different bit of the first register means a shift register pair each mapped to a different list element for automatically storing the current and previous state of the bit of the first register means;
means for resetting the bits of the second register means to clear the register means;
first means cooperative with the receiving means for setting the first register means bits mapped to the elements of the first received list and for setting or resetting the first register means bits mapped to the elements of other received lists;
means cooperative with the receiving means for storing in the first memory means the elements of the first received list;
means cooperative with the first means for transferring, within the shift register pairs, the states stored by the second register means bits to the first register means bits, following setting or resetting of the first register means bits associated with elements of the second, and each subsequent, received list;
means cooperative with the state transferring means for activating the means for resetting the bits of the second register means following each transfer; and
means for transferring from the first memory means to the second memory means elements mapped to set first register means bits;
whereby the intersection list comprises the elements stored in the second memory means.

22. The apparatus of claim 21 wherein the element transferring means comprise:
means for removing the element from the first memory;
means cooperative with the removing means for setting or resetting the first register means bit mapped to the removed element; and
means responsive to the setting or resetting means for storing the removed element in the second memory if the second register means bit mapped to the removed element is set.

23. The apparatus of claim 21, wherein the list elements are of a first and a second type and wherein same elements of both types are mapped to a same bit of the first register means, further comprising third register means having a plurality of bits a different one mapped to each different element of the second type and all same elements of the second type being mapped to a same bit of the third register means;

means for resetting the bits of the third register means to clear the register means;

means cooperative with the receiving means for setting the third register means bits mapped to the second-type elements of the first received list; and means cooperative with the receiving means for setting the third register means bit mapped to a received element of the other received lists either if the third register means bit mapped to the element is set or if the received element is of the second type and the second register means bit mapped to the element is set and otherwise for resetting the third register means bit mapped to the element;

whereby elements stored in the second memory means that are mapped to set bits of the third register means are second-type elements of the intersection list.

24. Apparatus for generating a list representing difference of a plurality of lists each having at least one element, comprising:

means for receiving lists;

first and second memory means;

first register means having a plurality of bits a different one mapped to each different element of the plurality of lists and all same elements being mapped to a same bit of the first register means;

means for resetting the bits of the first register means to clear the register means;

means cooperative with the receiving means for setting the first register means bits mapped to the elements of the first received list;

means cooperative with the receiving means for storing in the first memory the elements of the first received list;

means cooperative with the receiving means for resetting the first register means bits mapped to selected elements of lists received subsequent to the first list; and means for transferring from the first memory means to the second memory means elements mapped to set first register means bits;

whereby the difference list comprises the elements stored in the second memory.

25. The apparatus of claim 24 further comprising second register means having a plurality of bits each forming with a bit of the first register means a shift register pair each mapped to a different list element for automatically storing the current and previous state of the bit of the first register means; and wherein the element transferring means comprise means for removing an element from the first memory, means cooperative with the removing means for setting or resetting the first register means bit mapped to the removed element, and means responsive to the setting or resetting means for storing the removed element in the second memory if the second register means bit mapped to the removed element is set.

26. The apparatus of claim 24 wherein the means for resetting the first register means bits mapped to selected elements comprise:

means for resetting the first register means bits mapped to all elements comprise:

means for resetting the first register means bits mapped to all elements of the subsequently-received lists.

27. The apparatus of claim 24, wherein the list elements are of a first and a second type and wherein same elements of both types are mapped to a same bit of the first register means, wherein the means for resetting the first register means bits mapped to selected elements comprise means for resetting the first register means bits mapped to the first-type elements of the subsequently-received lists; the apparatus further comprising second-type-element register means having a plurality of bits a different one mapped to each different element of the plurality of lists, means for resetting the bits of the second-type-element register means to clear the register means, means cooperative with the receiving means for setting the second-type-element register means bits mapped to the second-type elements of the first received list, and means cooperative with the receiving means for setting the second-type-element register means bit mapped to a received element of the other received lists if the received element is of the second type and the first register means bit mapped to the element is set and otherwise for resetting the second-type-element register means bit mapped to the element, whereby elements stored in the second memory means that are mapped to set bits of the second register means are second-type elements of the difference list.

28. The apparatus of claim 27 further comprising third register means having a plurality of bits each forming with a bit of the first register means a shift register pair each mapped to a different list element for automatically storing the current and previous state of the bit of the first register means; and wherein the means for setting the second-type-element register means bit mapped to a received element of the other received lists comprise means for setting the second-type-element register means bit mapped to the received element if the received element is of the second type and the third register means bit mapped to the element is set and otherwise for resetting the second-type-element register means bit mapped to the element.

29. Apparatus for comparing two lists each having at least one element, comprising:

means for receiving lists;

first register means having a plurality of bits a different one mapped to each different element of the plurality of lists and all same elements being mapped to a same bit of the first register means;

second register means having a plurality of bits each forming with a bit of the first register means a shift register pair each mapped to a different list element for automatically storing the current and previous state of the bit of the first register means;

means for resetting the bits of the first register means to clear the register means;

means cooperative with the receiving means for setting the first register means bits mapped to the elements of the first received list;

means cooperative with the receiving means for setting or resetting the first register means bits mapped to the elements of the second received list; and means responsive to the setting or resetting means for examining the second register means bits mapped to the elements of the second received list and generating an indication that the lists are different if any examined second register means bit is not set.

30. Apparatus for comparing two lists each having at least one element, wherein list elements are of a first and a second type, comprising:

means for receiving lists;

first register means having a plurality of bits a different one mapped to each different element of the plurality of lists and all same elements of both types being mapped to a same bit of the first register means;

means for resetting the bits of the first register means to clear the register means;

means cooperative with the receiving means for setting the first register means bits mapped to the elements of the first received list;

means cooperative with the receiving means for examining the first register means bits mapped to the elements of the second received list and generating an indication that the lists are different if an examined first register means bit is not set;

second register means having a plurality of bits a different one mapped to each different element of the second type and all same elements of the second type being mapped to a same bit of the second register means;

means for resetting the bits of the second register means to clear the register means;

means cooperative with the receiving means for setting the second register means bits mapped to the second-type elements of the first received list; and means cooperative with the receiving means for examining the second register means bits mapped to the elements of the second received list and generating an indication that the lists are different either if the received element is of the first type and the examined second register means bit is set or if the received element is of the second type and the examined second register means bit is not set.

31. Apparatus for processing a plurality of lists each having at least one element, comprising:

a first register having a plurality of bits a different one addressed by each different element of the plurality of lists and all same elements addressing a same bit of the first register;

means for resettting the value of the bits of the first register to clear the register;

a second register having a plurality of bits each mapped to a different one bit of the first register and forming therewith a shift register pair for automatically storing the current and previous value of the bit of the first register;

means for resetting the values of the bits of the second register to clear the register;

means for selectively transferring the values of the bits of the second register to the mapped bits of the first register;

a first and a second memory each for storing list elements;

a communication bus for conveying list elements to the first register and to the first and second memory;

means selectively responsive to an element conveyed by the bus for selectively setting and resetting the bit of the first register addressed by the conveyed bit element;

means, selectively responsive to a not set bit of the second register addressed by a list element conveyed by the bus, for loading the conveyed list element from the bus into the first memory;

means for selectively unloading a list element from the first memory onto the bus;

means, selectively responsive to a set bit of the second register addressed by a list element conveyed by the bus, for loading the conveyed list element from the bus into the second memory; and means for selectively unloading a list element from the second memory onto the bus.

* * * * *

UNITED STATES PATENT AND TRADEMARK OFFICE
CERTIFICATE OF CORRECTION

PATENT NO. : 4,758,947                                      Page 1 of 3
DATED      : July 19, 1988
INVENTOR(S): Ytzhak Levendel; Premachandran R. Menon; Suresh H. Patel It is certified that error appears in the above-identified patent and that said Letters Patent is hereby corrected as shown below:

Column 1, line 16, "area" should read --areas--. Column 2, line 7, "in" should read --is--; line 13 after "to" delete the comma. Column 3, line 5 "ard" should read --and--; line 18 "processin9" should read --processing--; line 19 "processin9" should read --processing--; line 23 "advanta9es" should read --advantages--; line 24 "followin9" should read --following--; line 26 "to9ether" should read --together--; line 26 "drawin9" should read --drawing--; line 29 "dia9ram" should read --diagram--; line 30 "are" should read --an--; line 37 "rnion" should read --union--. Column 4, line 64 "si9nal" should read --signal--; line 65 "len9th" should read --length--. Column 5, line 6 "beirg" should read --being--; line 31 "si9nal" should read --signal--; line 32 "bein9" should read --being--; line 33 "Returnin9" should read --Returning--. Column 6, line 2 "si9nal" should read --signal--; line 18 "gave" should read --have--; line 37 "sequencin9" should read --sequencing--; line 38 "9ate" should read --gate--; line 38 "lo9ic" should read --logic--; line 39 "9ates" should read --gates--; line 39 "lo9ical" should read --logical--; line 41 "9iven" should read --given--; line 43 "lo9ical" should read --logical--. Column 7, line 5 "bein9" should read --being--; line 7 "presenoe" should read --presence--; line 9 "lo9ical" should read --logical--; line 40

UNITED STATES PATENT AND TRADEMARK OFFICE
CERTIFICATE OF CORRECTION

PATENT NO. : 4,758,947

DATED : July 19, 1988

INVENTOR(S) : Ytzhak Levendel; Premachandran R. Menon; Suresh H. Patel

It is certified that error appears in the above-identified patent and that said Letters Patent is hereby corrected as shown below:

"re9isters" should read --registers--; lines 42 and 43 "re9isters" should read --registers--. Column 8, line 8 "$v_i-$" should read --$v_{\bar{i}}$--; line 12 "$v_i-$" should read --$v_{\bar{i}}$--; line 14 "$v_i-$" should read --$v_{\bar{i}}$--; line 28 "generally" should read --generally--; line 29 "$v_i-$" should read --$v_{\bar{i}}$--. Column 9, line 17 "bein9" should read --being--; line 17 "usin9" should read --using--; line 18 "re9isters" should read --registers--; line 21 "9enerate" should read --generate--; line 23 "lo9ic" should read --logic--; line 24 "lo9ic, includin9" should read --logic, including--; line 39 "$v_i-$" should read --$v_{\bar{i}}$--; line 54 delete the semi-colon. Column 10, line 5 "loadin9" should read --loading--; line 7 "si9nal" should read --signal--; line 8 "bein9" should read --being--; line 9 "310" should read --300--; line 23 "$v_i-$" should read --$v_{\bar{i}}$--; line 40 "$v_i-$" should read --$v_{\bar{i}}$--; line 42 "$v_i-$" should read --$v_{\bar{i}}$--; lines 58 and 59 "vecotor" should read --vector--. Column 11, line 14 "$v_i-$" should read --$v_{\bar{i}}$--; line 50 "followin9 resettin9" should read --following resetting--; line 60 "fault" should read --fault--. Column 13, line 23 "$v_i-$" should read --$v_{\bar{i}}$--; line 25 "$v_i-$" should read --$v_{\bar{i}}$--; line 60 "cn" should read --on--. Column 14, line 18 after "stack" delete the period; line 35 "list" should read --list--; line 60 "lo9ical" should read --logical--. Column 15, line 1 "Followin9" should read

UNITED STATES PATENT AND TRADEMARK OFFICE
CERTIFICATE OF CORRECTION

PATENT NO. : 4,758,947

DATED : July 19, 1988

INVENTOR(S) : Ytzhak Levendel; Premachandran R. Menon; Suresh H. Patel

It is certified that error appears in the above-identified patent and that said Letters Patent is hereby corrected as shown below:

--Following--; line 28 "correspording" should read --corresponding--. Column 16, line 27 "block" should read --block--; line 34 "PL" should read --PU--.Column 19, line 8 "loadin9" should read --loading--. Column 23, line 36 "application's" should read --applications--; line 37 "a1gebra" should read --algebra--. Column 24, line 37 delete "of". Column 25, line 1 "second-type-elements" should read --second-type elements--; line 19 "reigster" should read --register--; lines 36 and 37 "registars" should read --registers--; line 59 after "removing", "the" should read --an--. Column 26, line 3 after "all" delete "the"; line 33 "eac" should read --each--; line 51 "elemants" should read --elements--. Column 30, line 56 "removing the" should read --removing an--. Column 33, line 30 "if an" should read --if any--.

Signed and Sealed this

Tenth Day of July, 1990

*Attest:*

HARRY F. MANBECK, JR.

*Attesting Officer*     *Commissioner of Patents and Trademarks*